US012812893B2

(12) United States Patent
Bothe et al.

(10) Patent No.: US 12,812,893 B2
(45) Date of Patent: Nov. 24, 2026

(54) BARRIER STRUCTURE FOR SUB-100 NANOMETER GATE LENGTH DEVICES

(71) Applicant: MACOM Technology Solutions Holdings, Inc., Lowell, MA (US)

(72) Inventors: Kyle Bothe, Cary, NC (US); Christer Hallin, Hillsborough, NC (US); Helder Jose DaSilva Antunes, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 852 days.

(21) Appl. No.: 17/951,711

(22) Filed: Sep. 23, 2022

(65) Prior Publication Data

US 2024/0105824 A1 Mar. 28, 2024

(51) Int. Cl.

| | |
|---|---|
| ***H10D 30/47*** | (2025.01) |
| ***H10D 62/824*** | (2025.01) |
| ***H10D 62/85*** | (2025.01) |
| ***H10D 64/20*** | (2025.01) |
| *H10D 62/82* | (2025.01) |
| *H10D 62/832* | (2025.01) |

(52) U.S. Cl.

CPC ......... *H10D 30/475* (2025.01); *H10D 62/824* (2025.01); *H10D 62/8503* (2025.01); *H10D 64/205* (2025.01); *H10D 62/82* (2025.01); *H10D 62/8325* (2025.01)

(58) Field of Classification Search

CPC .. H10D 30/471; H10D 30/472; H10D 30/473; H10D 30/4732; H10D 30/4735; H10D 30/4738; H10D 30/474; H10D 30/475; H10D 30/4755; H10D 30/476; H10D 30/477; H10D 30/478

See application file for complete search history.

(56) References Cited

U.S. PATENT DOCUMENTS

| | | | | |
|---|---|---|---|---|
| 5,151,758 | A * | 9/1992 | Smith | H10D 62/228 257/287 |
| 6,548,333 | B2 | 4/2003 | Smith | |
| 6,777,278 | B2 | 8/2004 | Smith | |
| 6,849,882 | B2 * | 2/2005 | Chavarkar | H10D 30/4732 257/191 |
| 7,170,111 | B2 | 1/2007 | Saxler | |
| 7,456,443 | B2 | 11/2008 | Saxler et al. | |
| 7,709,859 | B2 | 5/2010 | Smith et al. | |
| 9,166,033 | B2 | 10/2015 | Saxler et al. | |
| 10,971,612 | B2 | 4/2021 | Bothe et al. | |

(Continued)

OTHER PUBLICATIONS

"Above 600mS/mm Transconductance with 2.3A/mm Drain Current Density AlN/GaN High-Electron-Mobility Transistors Grown on Silicon" by Farid Medjdoub et al. in Applied Physics Express 4 (2011) 064106 (Year: 2011).*

*Primary Examiner* — Eric A. Ward
(74) *Attorney, Agent, or Firm* — Perilla Knox & Hildebrandt LLP; Jason M. Perilla

(57) ABSTRACT

Transistor devices are provided. In one example, the transistor device includes a channel layer. The transistor device includes a multilayer barrier structure on the channel layer. The transistor device includes a gate contact having a gate length of about 100 nm or less. A ratio of the gate length to a thickness of the multilayer barrier structure is in a range of about 8:1 to about 16:1.

28 Claims, 9 Drawing Sheets

(56) References Cited

U.S. PATENT DOCUMENTS

| | | | | |
|---|---|---|---|---|
| 2007/0284614 | A1* | 12/2007 | Adesida | H10D 30/015 257/E29.252 |
| 2009/0045439 | A1* | 2/2009 | Hoshi | H10D 30/015 257/E29.247 |
| 2009/0212324 | A1* | 8/2009 | Tamai | H10D 30/4755 257/192 |
| 2011/0241020 | A1* | 10/2011 | Saunier | H10D 30/4755 257/77 |
| 2018/0083133 | A1* | 3/2018 | Bayram | H10D 62/8503 |
| 2019/0348531 | A1* | 11/2019 | Kimura | H10D 62/405 |
| 2021/0257486 | A1* | 8/2021 | Wong | H10D 64/01 |
| 2022/0320326 | A1* | 10/2022 | Cheng | H10D 62/824 |
| 2024/0363745 | A1* | 10/2024 | Gupta | H10D 30/475 |

* cited by examiner

BARRIER STRUCTURE FOR SUB-100 NANOMETER GATE LENGTH DEVICES

FIELD

The present disclosure relates generally to semiconductor devices, and more particularly to transistor devices.

BACKGROUND

Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

Power semiconductor devices may be fabricated from wide bandgap semiconductor materials (e.g., having a bandgap greater than 1.40 eV). For example, power HEMTs may be fabricated from gallium nitride (GaN) or other Group III-nitride-based material systems that are formed, for instance, on a silicon carbide (SiC) substrate or other substrate. As used herein, the term "Group III-nitride" refers to those semiconducting compounds formed between nitrogen and the elements in Group III of the periodic table, usually aluminum (Al), gallium (Ga), and/or indium (In). These compounds have empirical formulas in which one mole of nitrogen is combined with a total of one mole of the Group III elements. For high power, high temperature, and/or high frequency applications, devices formed in wide bandgap semiconductor materials such as silicon carbide (e.g., 2.996 eV bandgap for alpha silicon carbide at room temperature) and the Group III-nitrides (e.g., 3.36 eV bandgap for gallium nitride at room temperature) may provide higher electric field breakdown strengths and higher electron saturation velocities as compared to gallium arsenide (GaAs) and silicon (Si) based devices.

SUMMARY

Aspects and advantages of embodiments of the present disclosure will be set forth in part in the following description, or may be learned from the description, or may be learned through practice of the embodiments.

One example embodiment of the present disclosure is directed to a transistor device. The transistor device includes a channel layer. The transistor device includes a multilayer barrier structure on the channel layer. The transistor device includes a gate contact having a gate length of about 100 nm or less. A ratio of the gate length to a thickness of the multilayer barrier structure is in a range of about 8:1 to about 16:1.

Another example embodiment of the present disclosure is directed to a transistor device. The transistor device includes a channel layer. The transistor device includes a Group III-nitride based barrier structure on the channel layer. The transistor device includes a gate contact. The Group III-nitride based barrier structure has a peak thickness of less than about 120 Angstroms.

Another example embodiment of the present disclosure is directed to a transistor device. The transistor device includes a channel layer. The transistor device includes a barrier structure on the channel layer. The transistor device includes a gate contact having a gate length in a range of about 60 nm to about 100 nm. The transistor device includes a two-dimensional electron gas (2 DEG) at an interface between the channel layer and the barrier structure, the 2 DEG having an electron mobility in a range of about 800 cm2/Vs to about 2500 cm2/Vs.

Another example embodiment of the present disclosure is directed to a transistor device. The transistor device includes a channel layer. The transistor device includes a barrier structure on the channel layer. The transistor device includes a two-dimensional electron gas (2 DEG) at an interface between the channel layer and the barrier structure, the 2 DEG having a transconductance in a range of about 500 mS/mm to about 800 mS/mm. A peak thickness of the barrier structure is in a range of about 50 Angstroms to about 120 Angstroms.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
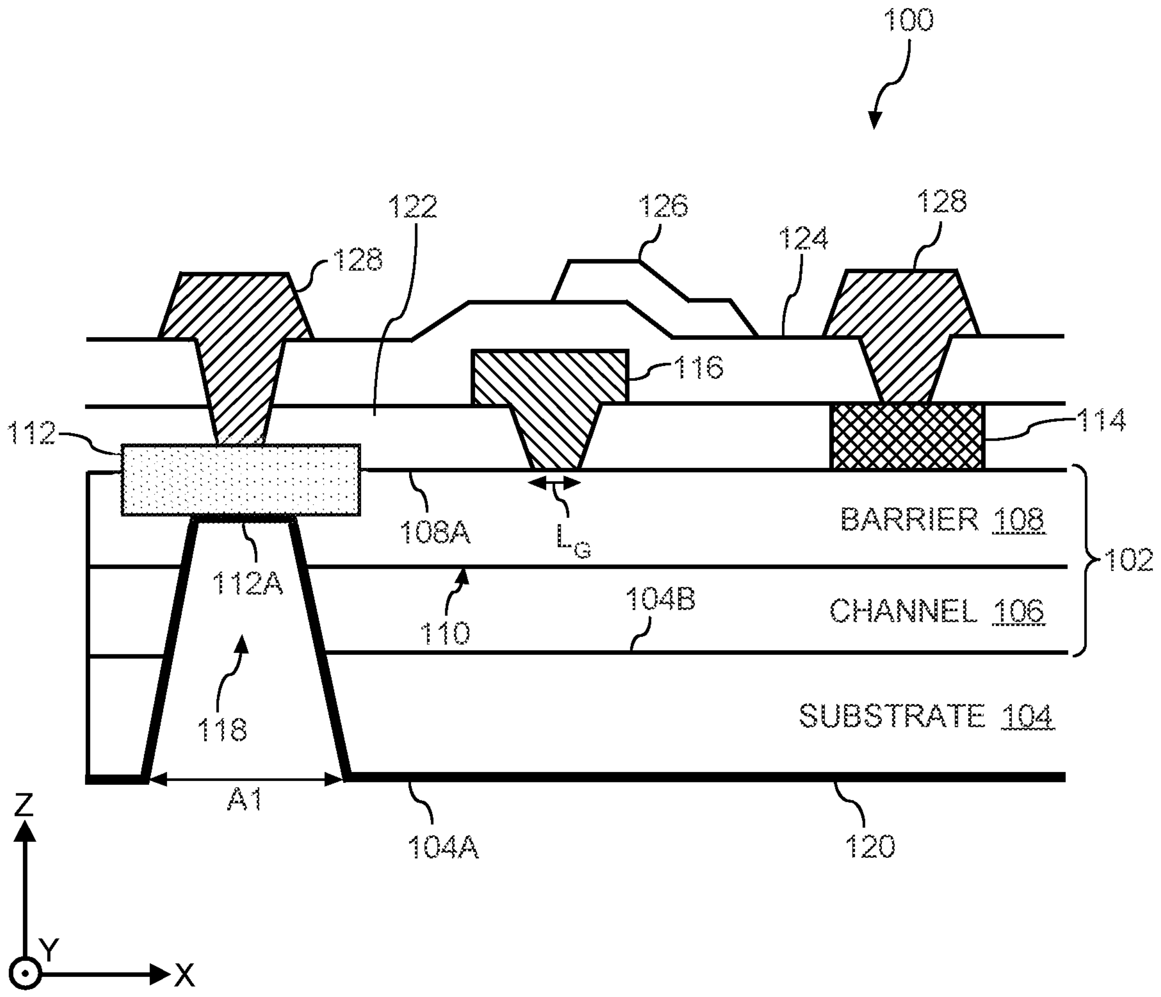
FIG. 1 depicts a cross-sectional view of an example transistor device according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Transistor devices, such as high electron mobility transistors (HEMTs), may be used in power electronics applications. HEMTs fabricated in Group III-nitride based material systems may have the potential to generate large amounts of radio frequency (RF) power because of the combination of material characteristics that includes high breakdown fields, wide bandgaps, large conduction band offset, and/or high saturated electron drift velocity. As such, Group III-Nitride based HEMTs may be promising candidates for high frequency and/or high-power RF applications, as well as for low frequency high power switching applications, both as discrete transistors or as coupled with other circuit elements, such as in monolithic microwave integrated circuit (MMIC) devices.

Field effect transistors such as HEMT devices may be classified into depletion mode and enhancement mode types, corresponding to whether the transistor is in an ON-state or an OFF-state at a gate-source voltage of zero. In enhancement mode devices, the devices are OFF at zero gate-source voltage, whereas in depletion mode devices, the device is ON at zero gate-source voltage. Often, high performance Group III-nitride-based HEMT devices may be implemented as depletion mode (normally-on) devices, in that they are conductive at a gate-source bias of zero volts due to the polarization-induced charge at the interface of the barrier and channel layers of the device.

When an HEMT device is in an ON-state, a two-dimensional electron gas (2 DEG) is formed at the heterojunction of two semiconductor materials with different bandgap energies (e.g., a junction between a barrier structure and a channel layer), where the smaller bandgap material has a higher electron affinity. The 2 DEG is an accumulation layer in the smaller bandgap material and can include a very high sheet electron concentration. Additionally, electrons that originate in the wider-bandgap semiconductor material transfer to the 2 DEG layer, allowing high electron mobility due to reduced ionized impurity scattering. This combination of high carrier concentration and high carrier mobility may give the HEMT device a very large transconductance (which may refer to the relationship between output current and input voltage) and may provide a strong performance advantage over MOSFETs for high-frequency applications.

Higher frequency RF applications, such as RF applications associated with frequencies of about 30 GHz or greater (e.g., millimeter wave frequencies or greater) can lead to the scaling of transistor devices to smaller nodes. For instance, a gate length of a gate contact associated with the transistor device may be scaled, for instance, from about 150 nm to about 100 nm or less. In some instances, the gate length of the gate contact may be in a range of, for example, about 40 nm to about 90 nm, such as about 60 nm to about 90 nm. To accommodate reduced gate length, a corresponding reduction in the size of structures of a transistor device may need to be implemented without significantly impacting performance of the transistor device, such as impacting the transconductance of the 2 DEG.

Aspects of the present disclosure are directed to barrier structures for transistor devices, such as HEMT devices, that accommodate smaller gate lengths while still providing enhanced performance. For instance, a transistor device may have a channel layer and a multilayer barrier structure on the channel layer. The multilayer barrier structure for the transistor device may be configured such that a ratio of a gate length of the transistor device to the thickness of the multilayer barrier structure is in range of about 8:1 to about 16:1, such as in a range of about 9:1 to about 11:1, such as about 10:1. For instance, a thickness of the multilayer barrier structure (e.g., a peak or maximum thickness of the multilayer barrier structure) may be in a range of about 50 Angstroms to about 120 Angstroms. The multilayer barrier structure, in some embodiments, may be a multilayer Group III-nitride based barrier structure.

The barrier structure may allow for a 2 DEG with high electron mobility and high carrier concentration and thus a high transconductance despite its reduced thickness. For instance, the transistor devices may have a 2 DEG having an electron mobility in a range of about 800 $cm^2/Vs$ to about 2500 $cm^2/Vs$, such as in a range of about 1600 $cm^2/Vs$ to about 2200 $cm^2/Vs$. The 2 DEG may a carrier concentration in a range of about $1.2\times10^{13}$ $cm^{-2}$ to about $2.0\times10^{13}$ $cm^{-2}$. The 2 DEG may have a transconductance in a range of about 500 to about 800 mS/mm, such as in a range from about 600 mS/mm to about 700 mS/mm.

In some embodiments, the barrier structure may include a first Group III-nitride layer and a second Group III-nitride layer on the first Group III-nitride layer. The first Group III-nitride layer may be, for instance, an AlN layer having a thickness in a range of about 5 Angstroms to about 15 Angstroms. The second Group III-nitride layer may be an AlGaN layer. The AlGaN layer may have an aluminum mole fraction of about 30% or greater, such as in a range of about 30% to about 40%, such as about 35%. By keeping the AlN thickness thin, the transistor device may have higher electron mobility in the 2 DEG. The higher aluminum mole fraction in the AlGaN layer can provide a larger concentration of electrons in the 2 DEG.

Another barrier structure according to example aspects of the present disclosure may include, for instance, an AlN layer and a GaN layer. The AlN layer may have a thickness in a range of about 30 Angstroms to about 60 Angstroms. The GaN layer may have a thickness in a range of about 10 Angstroms to about 70 Angstroms. Yet another example barrier structure can include, for instance, a plurality of AlN layers and a plurality of AlGaN layers arranged in an alternating manner. The plurality of AlGaN layers in this example barrier structure may have an aluminum mole fraction in a range of about 0% (e.g., such that the AlGaN layer is a GaN layer) to about 40%, such as in a range of about 10% to about 30%, such as in a range of about 15% to about 25%.

Aspects of the present disclosure can provide technical effects and benefits. More particularly, the present inventors have discovered that the barrier structures according to example embodiments of the present disclosure may avoid softening of performance of transistor devices at reduced gate lengths due to, for instance, short channel effects and other effects that may result from a large barrier structure thickness. However, the barrier structures do not negatively impact the 2 DEG of the transistor device. Indeed, the barrier structures may provide a 2 DEG with high electron mobility and high carrier concentration. As a result, impact to performance of the transistor device associated with transconductance of the 2 DEG (e.g., on-resistance of the transistor device) may be reduced. In this way, the transistor devices according to example aspects of the present disclosure may be suitable for applications associated with advanced nodes and smaller gate lengths, such as for applications associated with higher frequencies (e.g., greater than about 30 GHz).

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the disclosure. The thickness of layers and regions in the drawings may be exaggerated for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the disclosure are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Aspects of the present disclosure are discussed with reference to an HEMT transistor device for purposes of illustration and discussion. Those of ordinary skill in the art, using the disclosures provided herein, will appreciate that certain aspects of the present disclosure may be applicable to other transistor devices or power semiconductor devices without deviating from the scope of the present disclosure.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

FIG. 1 depicts a cross-sectional view of an example HEMT device 100 according to example embodiments of the present disclosure. FIG. 1 is intended to represent structures for identification and description and is not intended to represent the structures to physical scale. The HEMT device 100 may include a semiconductor structure 102. The semiconductor structure 102 may be a Group III-nitride semiconductor structure.

As used herein, the term "Group III-nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

The semiconductor structure 102 may be on a substrate 104. The substrate 104 may be a semiconductor material. For instance, the substrate 104 may be a silicon substrate, a silicon carbide (SiC) substrate, a sapphire substrate, or other suitable substrate. In some embodiments, the substrate 104 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 104 may have a resistivity equal to or higher than about $1\times10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200,022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 104 may be a SiC wafer, and the HEMT device 100 may be formed, at least in part, via wafer-level processing, and the wafer may then be diced to provide a plurality of individual HEMT devices 100.

The substrate 104 may have a lower surface 104A and an upper surface 104B. In some embodiments, the substrate 104 of the HEMT device 100 may be a thinned substrate 104. In some embodiments, the thickness of the substrate 104 (e.g., in a vertical Z direction in FIG. 1) may be about 100 μm or less, such as about 75 μm or less, such as about 50 μm or less.

The semiconductor structure 102 may include a channel layer 106 on the upper surface 104B of the substrate 104 (or on the optional layers described further herein, such as an optional buffer layer or nucleation layer). The semiconductor structure 102 may include a barrier structure 108 on an upper surface of the channel layer 106. In some embodiments, the channel layer 106 and the barrier structure 108 may each be formed by epitaxial growth. Techniques for epitaxial growth of Group III-nitrides have been described in, for example, U.S. Pat. Nos. 5,210,051, 5,393,993, and 5,523,589, the disclosures of which are incorporated by reference herein. The channel layer 106 may have a bandgap that is less than the bandgap of the barrier structure 108. The channel layer 106 may have a larger electron affinity than the barrier structure 108. The channel layer 106 and the barrier structure 108 may include Group III-nitride based materials.

In some embodiments, the channel layer 106 may be a Group III-nitride, such as $Al_wGa_{1-w}N$, where $0\leq w<1$, provided that the energy of the conduction band edge of the channel layer 106 is less than the energy of the conduction band edge of the barrier structure 108 at the interface between the channel layer 106 and barrier structure 108. In some embodiments, the aluminum mole fraction w is approximately 0 (e.g., less than 5%, such as 0%), indicating that the channel layer 106 is GaN. The channel layer 106 may or may include other Group III-nitrides such as InGaN, AlInGaN or the like. The channel layer 106 may be undoped ("unintentionally doped") and may be grown to a thickness in the range of about 0.5 μm to about 5 m, such as about 2 m. The channel layer 106 may be a multi-layer structure, such as a superlattice or combinations of GaN, AlGaN or the like. The channel layer 106 may be under compressive strain in some embodiments.

The barrier structure 108 may be a multilayer barrier structure 108. Details concerning example barrier structures 108 will be discussed with reference to FIGS. 2-12. The channel layer 106 and/or the barrier layer 108 may be deposited, for example, by metal-organic chemical vapor deposition (MOCVD), molecular beam epitaxy (MBE), or hydride vapor phase epitaxy (HVPE). A 2 DEG 110 may be induced in the channel layer 106 at an interface between the channel layer 106 and the barrier structure 108. The 2 DEG 110 is highly conductive and allows conduction between the source and drain regions of the HEMT device 100.

While the HEMT device 100 is shown with a substrate 104, channel layer 106 and barrier layer 108 for purposes of illustration, the HEMT device 100 may include additional layers/structures/elements. For instance, the HEMT device 100 may include a buffer layer and/or nucleation layer(s) between substrate 104 and the channel layer 106. For example, an AlN buffer layer may be on the upper surface 104B of the substrate 104 to provide an appropriate crystal structure transition between a SiC substrate 104 and the channel layer 106. The optional buffer/nucleation/transition layers may be deposited by MOCVD, MBE, and/or HYPE.

The HEMT device 100 may include a cap layer on the barrier structure 108. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,709,269, 7,709,859 and 10,971,612, the disclosures of which are incorporated by reference herein. Additionally, strain balancing transition layer(s) may also and/or alternatively be provided as described, for example, in U.S. Pat. No. 7,030,428, the disclosure of which is incorporated by reference herein.

The HEMT device 100 may include a source contact 112 on an upper surface 108A of the barrier structure 108 or otherwise contacting the barrier structure 108. The HEMT device 100 may include a drain contact 114 on the upper surface 108A of the barrier structure 108 or otherwise contacting the barrier structure 108. The source contact 112 and the drain contact 114 may be laterally spaced apart from each other. In some embodiments, the source contact 112 and the drain contact 114 may include a metal that may form an ohmic contact to a Group III-nitride based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), nickel (Ni), gold (Au), aluminum (Al), tantalum (Ta), molybdenum (Mo), NiSix, titanium silicide (TiSi), titanium nitride (TiN), tungsten silicon nitride (WsiN), platinum (Pt) and the like.

In some embodiments, the source contact 112 may be an ohmic source contact 112. The drain contact 114 may be an ohmic drain contact 114. Thus, the source contact 112 and/or the drain contact 114 may include an ohmic contact portion in direct contact with the barrier structure 108. In some embodiments, the source contact 112 and/or the drain contact 114 may include a plurality of layers to form an ohmic contact that may be provided as described, for example, in U.S. Pat. Nos. 8,563,372 and 9,214,352, the disclosures of which are incorporated by reference herein.

The HEMT device 100 may include a gate contact 116 on the upper surface 108A of the barrier structure 108 or otherwise contacting the barrier structure 108 (e.g., recessed into the barrier structure 108). The gate contact 116 may have a gate length $L_G$. The gate length $L_G$ may be the length of the gate contact 116 along the portion of the gate contact 116 that is on the semiconductor structure 102 (e.g., the length of the lowermost portion of the gate contact 116 in contact with the semiconductor structure 102). In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The material of the gate contact 116 may be chosen based on the composition of the barrier structure 108, and may, in some embodiments, be a Schottky contact. Materials capable of making a Schottky contact to a Group III-nitride based semiconductor material may be used, such as, for example, nickel (Ni), platinum (Pt), nickel silicide (NiSix), copper (Cu), palladium (Pd), chromium (Cr), tungsten (W) and/or tungsten silicon nitride (WsiN).

The source contact 112 may be coupled to a reference signal such as, for example, a ground voltage or other reference signal. The coupling to the reference signal may be provided by a via 118 that extends from a lower surface 104A of the substrate 104, through the substrate 104 and the channel layer 106 to the upper surface 108A of the barrier structure 108. The via 118 may expose a bottom surface of the ohmic portion 112A of the source contact 112. A back metal layer 120 may be on the lower surface 104A of the substrate 104 and on side walls of the via 118. The back metal layer 120 may directly contact the ohmic portion 112A of the source contact 112. In some embodiments a contact area between the back metal layer 120 and the bottom surface of the ohmic portion 112A of the source contact 112 may be fifty percent or more of an area of the bottom surface of the ohmic portion 112A of the source contact 112. Thus, the back metal layer 120, and a signal coupled thereto, may be electrically connected to the source contact 112.

In some embodiments, the via 118 may have an oval or circular cross-section when viewed in a plan view. However, the present disclosure is not limited thereto. In some embodiments, a cross-section of the via 118 may be a polygon or other shape, as will be understood by one of ordinary skill in the art using the disclosures provided herein. In some embodiments, dimensions of the via (e.g., a length and/or a width) may be such that a largest cross-sectional area A1 of the via 118 is about 1000 $\mu m^2$ or less. The cross-sectional area A1 may be taken in a direction that is parallel to the lower surface 104A of the substrate 104 (e.g., the X-Y plane of FIG. 1). In some embodiments, the largest cross-sectional area A1 of the via 118 may be that portion of the via 118 that is adjacent the lower surface 104A of the substrate 104 (e.g., the opening of the via 118). For example, in some embodiments, a greatest width (e.g., in the X direction in FIG. 1) may be about 16 μm and a greatest length (e.g., in the Y direction in FIG. 1) may be about 40 μm, though the present disclosure is not limited thereto. In some embodiments, sidewalls of the via 118 may be inclined and/or slanted with respect to the lower surface 104A of the substrate 104. In some embodiments, the sidewalls of the via 118 may be approximately perpendicular to the lower surface 104A of the substrate 104.

Depending on the embodiment, the drain contact 114 may be formed on, in and/or through the barrier structure 108, and there can be ion implantation into the materials around the drain contact 114 to reduce resistivity and provide improved ohmic contact to the semiconductor material. In yet other embodiments, there is no source via 118, and the source contact 112 is formed on, in and/or through the barrier structure 108, and there can be ion implantation in the materials around the source contact 112 to reduce resistivity and provide improved ohmic contact to the semiconductor material. Where there is no source via 118, the electrical connections to the source contact 112 can be made on the same side as the gate contact 116 and the drain contact 114. In some examples, the connections to the source contact 112, drain contact 114, and/or gate contact 116 can be made from the top and/or the bottom to provide for flip chip configuration of the HEMT device 100. In some examples, thermal paths may be provided from the top and/or bottom to provide for flip chip configuration of the HEMT device 100.

The HEMT device 100 may include a first insulating layer 122. The first insulating layer 122 may directly contact the upper surface of the semiconductor structure 102 (e.g., contact the upper surface 108A of the barrier structure 108). The HEMT device 100 may include a second insulating layer 124. The second insulating layer 124 may be on the first insulating layer 122. It will also be appreciated that more than two insulating layers may be included in some embodiments. The first insulating layer 122 and/or the second insulating layer 124 may serve as passivation layers for the HEMT device 100. The first insulating layer 122 and/or the second insulating layer 124 may be dielectric layers. Different dielectric materials may be used such as a SiN, $SiO_2$, Si, Ge, MgOx, MgNx, ZnO, SiNx, SiOx, alloys or layer sequences thereof, or epitaxial materials.

The source contact 112, the drain contact 114, and the gate contact 116 may be in the first insulating layer 122. In some embodiments, at least a portion of the gate contact 116 may be on the first insulating layer 122. In some embodiments, the gate contact 116 may be a T-shaped gate and/or a gamma gate, the formation of which is discussed by way of example in U.S. Pat. Nos. 8,049,252, 7,045,404, and 8,120,064, the disclosures of which are incorporated by reference herein. The second insulating layer 124 may be on the first insulating layer 122 and on portions of the source contact 112, drain contact 114, and gate contact 116. The protrusions from the gate can also be referred to as a field plate integrated with the gate.

Field plates 126 may be on the second insulating layer 124 as illustrated in FIG. 1, or on another insulating layer depending on the number of insulating layers included in the HEMT device 100. At least a portion of a field plate 126 may be on the gate contact 116. At least a portion of the field plate 126 may be on a portion of the second insulating layer 124 that is between the gate contact 116 and the drain contact 114. The field plate 126 may reduce the peak electric field in the HEMT device 100, which may result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is incorporated by reference herein.

Metal contacts 128 may be in the second insulating layer 124 as illustrated in FIG. 1, or on another insulating layer depending on the number of insulating layers included in the HEMT device 100. The metal contacts 128 may provide interconnection between the source contact 112, drain contact 114, gate contact 116, and other parts of the HEMT device 100. Respective ones of the metal contacts 128 may directly contact respective ones of the drain contact 114 and/or source contact 112. The metal contacts 128 may include metal or other highly conductive material, including, for example, copper, cobalt, gold, and/or a composite metal.

A HEMT transistor may be formed by the active region between the source contact 112 and the drain contact 114 under the control of the gate contact 116 between the source contact 112 and the drain contact 114. FIG. 1 depicts a cross-sectional view of one unit of an HEMT device 100 for purposes of illustration. The HEMT device 100 may be formed adjacent to additional HEMT device units and may share, for instance, a source contact 112 with adjacent HEMT device units.

Figure 2:
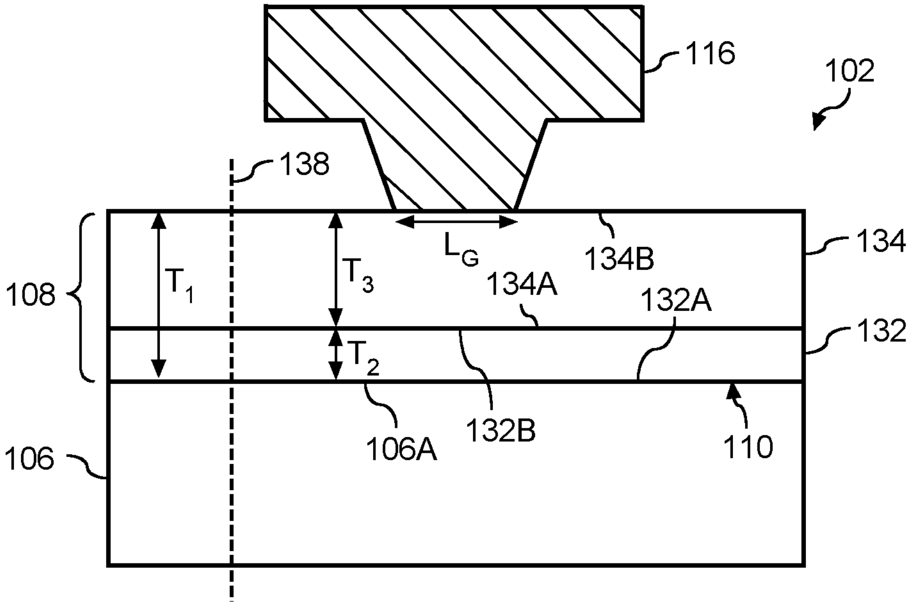
FIG. 2 depicts an example semiconductor structure for a transistor device according to example embodiments of the present disclosure.

FIG. 2 depicts an example semiconductor structure 102 according to example aspects of the present disclosure that may be used, for instance, in the HEMT device 100 of FIG. 1. FIG. 2 is intended to represent structures for identification and description and is not intended to represent the structures to physical scale. The semiconductor structure 102 includes a multilayer barrier structure 108 on a channel layer 106. A 2 DEG 110 is located at the interface between the multilayer barrier structure 108 and the channel layer 106.

The multilayer barrier structure 108 includes a first Group III-nitride layer 132 having a first surface 132A on a surface 106A of the channel layer 106. The multilayer barrier structure 108 includes a second Group III-nitride layer 134 on the first Group III-nitride layer 132 such that a first surface 134A of the second Group III-nitride layer 134 is on a second surface 132B of the first Group III-nitride layer 132 opposite the channel layer 106.

The gate contact 116 is on a second surface 134B of the second Group III-nitride layer 134. The gate contact 116 has a gate length $L_G$. The gate length $L_G$ can be the length of the gate contact along the second surface 134B of the second Group III-nitride layer 134. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_1$. The thickness $T_1$ may be the peak thickness of the multilayer barrier structure 108. For instance, the multilayer barrier structure 108 may have a uniform or nearly uniform thickness. In this example, the thickness $T_1$ may be the peak thickness (e.g., maximum thickness) of the multilayer barrier structure 108. The thickness $T_1$ may be in a range, for instance, of about 50 Angstroms to about 120 Angstroms. For instance, the thickness $T_1$ may be in a range of about 75 Angstroms to about 115 Angstroms. In some embodiments, the thickness $T_1$ is about 100 Angstroms. A ratio of the gate length $L_G$ of the gate contact 116 to the thickness $T_1$ of the multilayer barrier structure 108 may be in range of about 8:1 to about 16:1, such as in a range of about 9:1 to about 11:1, such as about 10:1.

The first Group III-nitride layer 132 may be a Group III-nitride, such as $Al_xGa_{1-x}N$, where x is the aluminum mole fraction in the first Group III-nitride layer 132. The energy of the conduction band edge of the first Group III-nitride layer 132 is greater than the energy of the conduction band edge of the channel layer 106 at the interface between the channel layer 106 and multilayer barrier structure 108. In some embodiments, the aluminum mole fraction x is such that $x \geq 0.5$ (e.g., the aluminum mole fraction is greater than about 50%), indicating that the first Group III-nitride layer 132 is an AlGaN layer. In some embodiments, the aluminum mole fraction x is such that $x \geq 0.75$ (e.g., the aluminum mole fraction is greater than about 75%), indicating that the first Group III-nitride layer 132 is an AlGaN layer. In some embodiments, the aluminum mole fraction is about 1 (e.g., the aluminum mole fraction is about 100%), indicating that the first Group III-nitride layer 132 is an AlN layer. However, the first Group III-nitride layer 132 may include other Group III elements (e.g., In) without deviating from the scope of the present disclosure. The first Group III-nitride layer 132 may have a thickness $T_2$ in a range of about 5 Angstroms to about 15 Angstroms, such as about 10 Angstroms.

The second Group III-nitride layer 134 may be a Group III-nitride, such as $Al_yGa_{1-y}N$, where y is the aluminum mole fraction in the second Group III-nitride layer 134. The aluminum concentration of the second Group III-nitride layer 134 may be less than an aluminum concentration of the first Group III-nitride layer 132. In some embodiments, the aluminum mole fraction y is such that $0.3 < y \leq 0.4$ (e.g., the aluminum mole fraction is in a range of about 30% to about 40%), indicating that the second Group III-nitride layer 134 is an AlGaN layer. In some embodiments, the aluminum mole fraction y is about 0.35 (e.g., the aluminum mole fraction is about 35%). The second Group III-nitride layer 134 may include other Group III elements (e.g., In) without deviating from the scope of the present disclosure. The second Group III-nitride layer 134 may have a thickness $T_3$ that is greater than a thickness $T_2$ of the first Group III-nitride layer 132. For instance, the second Group III-nitride layer 134 may have a thickness $T_3$ in a range of about 70 Angstroms to about 100 Angstroms, such as about 90 Angstroms.

In some embodiments, the second Group III-nitride layer 134 may have a graded concentration of aluminum that increases from the second surface 134B to the first surface 134A of the second Group III-nitride layer 134. For instance, the second Group III-nitride layer 134 may have a graded concentration of aluminum such that the second Group III-nitride layer 134 has a higher aluminum concentration at the first surface 134A at an interface between the first Group III-nitride layer 132 and the second Group III-nitride layer 134 relative to the second surface 134B of the second Group III-nitride layer 134 opposite the first Group III-nitride layer 132. The graded concentration of aluminum can increase from the second surface 134B to the first surface 134A at a consistent change in concentration, at a varying change in concentration, or combinations thereof. For instance, the graded concentration of aluminum can increase from an aluminum mole fraction of about 0% at the second surface 134B to an aluminum mole fraction of about 40% at the first surface 134A.

Figure 3:
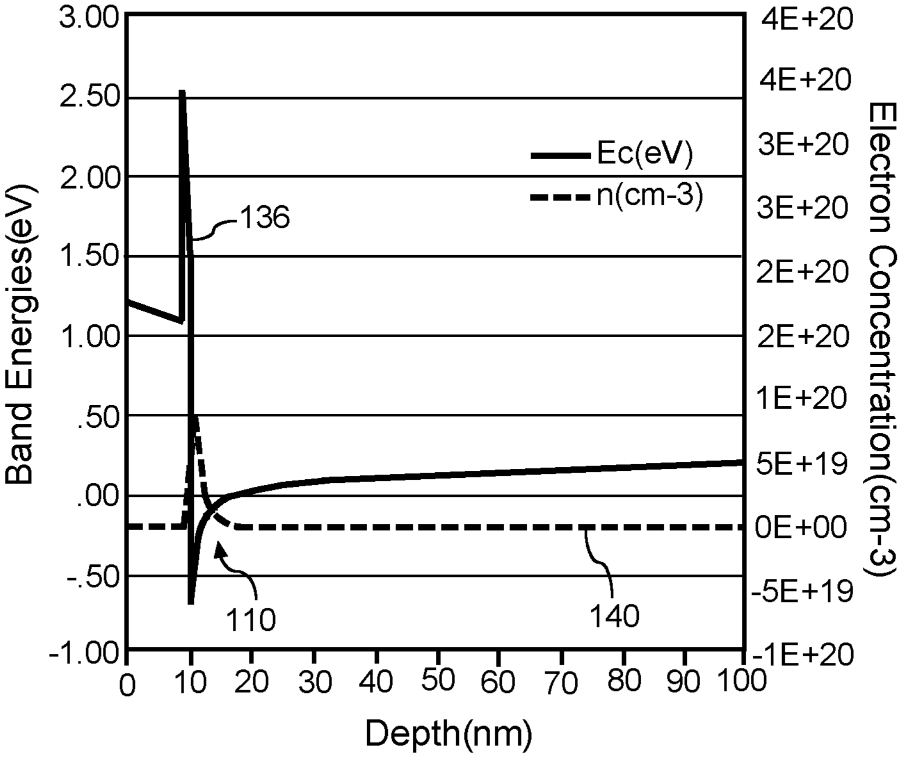
FIG. 3 depicts a graph illustrating simulated conduction band energy and electron density as a function of depth (in nanometers (nm)) for a transistor device associated with the semiconductor structure of FIG. 2.

FIG. 3 depicts a graph illustrating simulated conduction band energy and electron density as a function of depth (in nanometers (nm)) for a transistor device having the multilayer barrier structure 108 of FIG. 2. Curve 136 plots conduction band energy Ec (eV) as a function of depth (nm)

along line 138 of FIG. 2. Curve 140 plots electron carrier density ($cm^{-3}$) as a function of depth (nm) along line 138 of FIG. 2. Because of the presence of aluminum in the crystal lattice, the multilayer barrier structure 108 has a wider bandgap than the channel layer 106. Thus, the interface between the channel layer 106 and the multilayer barrier structure 108 at the 2 DEG 110 forms a heterostructure in which the conduction and valence bands Ec and Ev (not shown) are offset. Charge is induced due to the piezoelectric effect and spontaneous doping. As shown in FIG. 3, the conduction band Ec dips below the Fermi level in the area of the 2 DEG 110. Consequently, the 2 DEG 110 is induced at the heterojunction between the channel layer 106 and the multilayer layer 108.

In transistor devices having the multibarrier structure 108 of FIG. 2, the 2 DEG 110 may have a carrier concentration, for instance, in a range of about $1.2\times10^{13}$ $cm^{-2}$ to about $2.0\times10^{13}$ $cm^{-2}$. The 2 DEG may have an electron mobility in a range of about 1600 cm2/Vs to about 2200 cm2/Vs, such as about 2000 cm2/Vs. The 2 DEG may have a transconductance in a range of about 500 to about 800 mS/mm, such as about 600 mS/mm to about 700 mS/mm.

Figure 4:
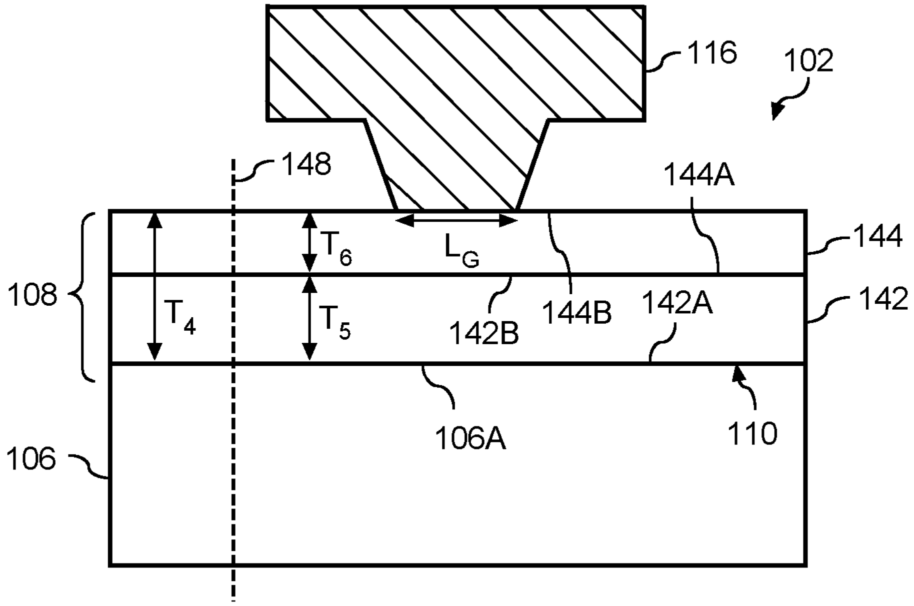
FIG. 4 depicts an example semiconductor structure for a transistor device according to example embodiments of the present disclosure.

FIG. 4 depicts an example semiconductor structure 102 according to example aspects of the present disclosure that may be used, for instance, in the HEMT device 100 of FIG. 1. FIG. 4 is intended to represent structures for identification and description and is not intended to represent the structures to physical scale. The semiconductor structure 102 includes a multilayer barrier structure 108 on a channel layer 106. A 2 DEG 110 is located at the interface between the multilayer barrier structure 108 and the channel layer 106.

The multilayer barrier structure 108 includes a first Group III-nitride layer 142 having a first surface 142A on a surface 106A of the channel layer 106. The multilayer barrier structure 108 includes a second Group III-nitride layer 144 on the first Group III-nitride layer 142 such that a first surface 144A of the second Group III-nitride layer 144 is on a second surface 142B of the first Group III-nitride layer 142 opposite the channel layer 106.

The gate contact 116 is on a second surface 144B of the second Group III-nitride layer 144. The gate contact 116 has a gate length $L_G$. The gate length $L_G$ can be the length of the gate contact along the second surface 144B of the second Group III-nitride layer 144. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_4$. The thickness $T_4$ may be the peak thickness of the multilayer barrier structure 108. For instance, the multilayer barrier structure 108 may have a uniform or nearly uniform thickness. In this example, the thickness $T_4$ may be the peak thickness (e.g., maximum thickness) of the multilayer barrier structure 108. The thickness $T_4$ may be in a range, for instance, of about 50 Angstroms to about 120 Angstroms. For instance, the thickness $T_4$ may be in a range of about 40 Angstroms to about 100 Angstroms. In some embodiments, the thickness $T_4$ is about 100 Angstroms. A ratio of the gate length $L_G$ of the gate contact 116 to the thickness $T_4$ of the multilayer barrier structure 108 may be in range of about 8:1 to about 16:1, such as in a range of about 9:1 to about 11:1, such as about 10:1.

The first Group III-nitride layer 142 may be a Group III-nitride, such as $Al_xGa_{1-x}N$, where x is the aluminum mole fraction in the first Group III-nitride layer 152. The energy of the conduction band edge of the first Group III-nitride layer 142 is greater than the energy of the conduction band edge of the channel layer 106 at the interface between the channel layer 106 and multilayer barrier structure 108. In some embodiments, the aluminum mole fraction x is such that $x\geq0.5$ (e.g., the aluminum mole fraction is greater than about 50%), indicating that the first Group III-nitride layer 142 is an AlGaN layer. In some embodiments, the aluminum mole fraction x is such that $x\geq0.75$ (e.g., the aluminum mole fraction is greater than about 75%), indicating that the first Group III-nitride layer 142 is an AlGaN layer. In some embodiments, the aluminum mole fraction is about 1 (e.g., the aluminum mole fraction is about 100%), indicating that the first Group III-nitride layer 142 is an AlN layer. However, the first Group III-nitride layer 142 may include other Group III elements (e.g., In) without deviating from the scope of the present disclosure. The first Group III-nitride layer 142 may have a thickness $T_5$ in a range of about 5 Angstroms to about 15 Angstroms, such as about 10 Angstroms.

The second Group III-nitride layer 144 may be a Group III-nitride, such as $Al_yGa_{1-y}N$, where y is the aluminum mole fraction in the second Group III-nitride layer 144. The aluminum concentration of the second Group III-nitride layer 144 may be less than an aluminum concentration of the first Group III-nitride layer 142. In some embodiments, the aluminum mole fraction is approximately 0 (e.g., the aluminum mole fraction is about 5% or less, such as 0%), indicating that the second Group III-nitride layer 144 is a GaN layer. The second Group III-nitride layer 144 may include other Group III elements (e.g., In) without deviating from the scope of the present disclosure. The second Group III-nitride layer 144 may have a thickness $T_6$ in a range of about 10 Angstroms to about 70 Angstroms, such as in a range of about 40 Angstroms to about 60 Angstroms.

Figure 5:
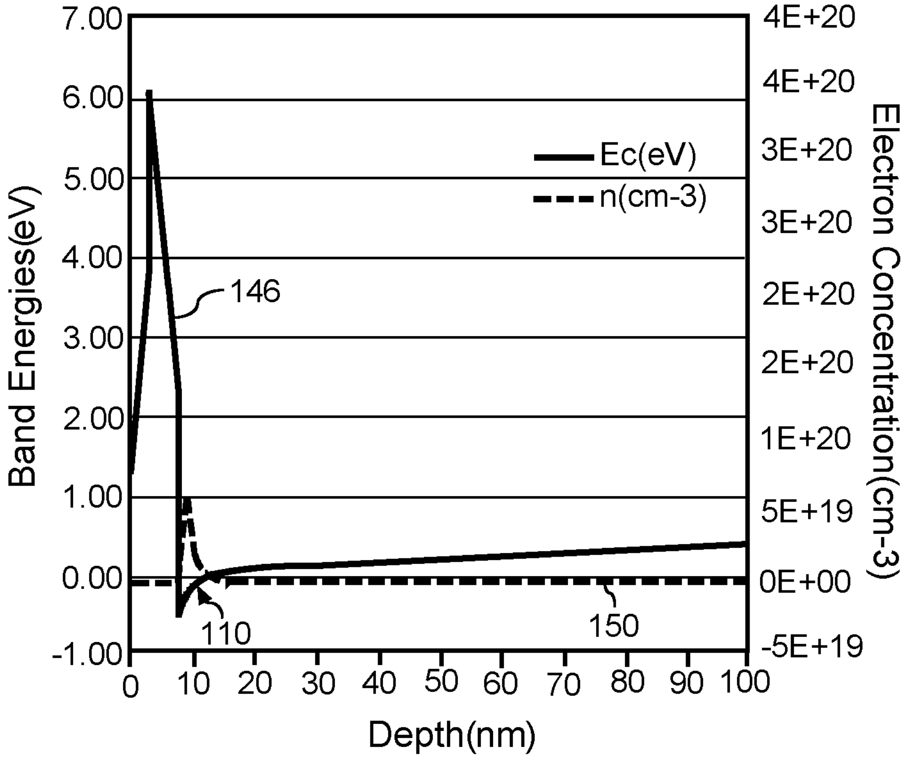
FIG. 5 depicts a graph illustrating simulated conduction band energy and electron density as a function of depth (in nm) for a transistor device associated with the semiconductor structure of FIG. 4.

FIG. 5 depicts a graph illustrating simulated conduction band energy and electron density as a function of depth (in nanometers (nm)) for a transistor device having the multilayer barrier structure 108 of FIG. 4. Curve 146 plots conduction band energy Ec (eV) as a function of depth (nm) along line 148 of FIG. 4. Curve 150 plots electron carrier density ($cm^{-3}$) as a function of depth (nm) along line 148 of FIG. 4. Similar to FIG. 3, the conduction band Ec in FIG. 5 dips below the Fermi level in the area of the 2 DEG 110. Consequently, the 2 DEG 110 is induced at the heterojunction between the channel layer 106 and the multilayer layer 108.

In transistor devices having the multibarrier structure 108 of FIG. 4, the 2 DEG 110 may have a carrier concentration, for instance, in a range of about $1.2\times10^{13}$ $cm^{-2}$ to about $2.0\times10^{13}$ $cm^{-2}$. The 2 DEG may have an electron mobility in a range of about 800 cm2/Vs to about 1600 cm2/Vs, such as about 1200 cm2/Vs. The 2 DEG may have a transconductance in a range of 500 to about 800 mS/mm, such as about 600 mS/mm to about 700 mS/mm.

Figure 6:
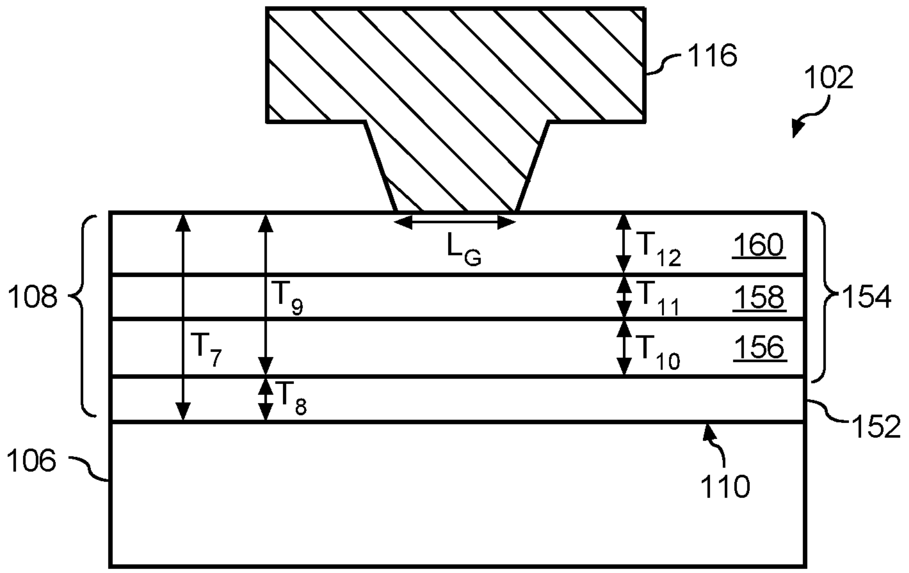
FIG. 6 depicts an example semiconductor structure for a transistor device according to example embodiments of the present disclosure.

FIG. 6 depicts an example semiconductor structure 102 according to example aspects of the present disclosure that may be used, for instance, in the HEMT device 100 of FIG. 1. FIG. 6 is intended to represent structures for identification and description and is not intended to represent the structures to physical scale. The semiconductor structure 102 includes a multilayer barrier structure 108 on a channel layer 106. A 2 DEG 110 is located at the interface between the multilayer barrier structure 108 and the channel layer 106.

The multilayer barrier structure 108 may include a plurality of Group III-nitride layers arranged in an alternating manner. For instance, the multilayer barrier structure 108 may include a first Group III-nitride layer 152. The multilayer barrier structure 108 may include a multilayer structure 154 of alternating Group III-nitride layers on the first Group III-nitride layer 152. In example embodiments, the multilayer structure 154 may include three layers, such as a first layer 156, a second layer 158, and a third layer 160. However, the multilayer structure 154 may include more or fewer layers without deviating from the scope of the present disclosure.

The gate contact 116 is on the multilayer structure 154. The gate contact 116 has a gate length $L_G$. The gate length $L_G$ can be the length of the gate contact 116 along the surface of the multilayer structure 154. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_7$. The thickness $T_7$ may be the peak thickness of the multilayer barrier structure 108. For instance, the multilayer barrier structure 108 may have a uniform or nearly uniform thickness. In this example, the thickness $T_7$ may be the peak thickness (e.g., maximum thickness) of the multilayer barrier structure 108. The thickness $T_7$ may be in a range, for instance, of about 50 Angstroms to about 120 Angstroms. For instance, the thickness $T_7$ may be in a range of about 75 Angstroms to about 115 Angstroms. In some embodiments, the thickness $T_7$ is about 100 Angstroms. A ratio of the gate length $L_G$ of the gate contact 116 to the thickness $T_7$ of the multilayer barrier structure 108 may be in range of about 8:1 to about 16:1, such as in a range of about 9:1 to about 11:1, such as about 10:1.

The first Group III-nitride layer 152 may be a Group III-nitride, such as $Al_xGa_{1-x}N$, where x is the aluminum mole fraction in the first Group III-nitride layer 152. The energy of the conduction band edge of the first Group III-nitride layer 152 is greater than the energy of the conduction band edge of the channel layer 106 at the interface between the channel layer 106 and multilayer barrier structure 108. In some embodiments, the aluminum mole fraction x is such that $x \geq 0.5$ (e.g., the aluminum mole fraction is greater than about 50%), indicating that the first Group III-nitride layer 152 is an AlGaN layer. In some embodiments, the aluminum mole fraction x is such that $x \geq 0.75$ (e.g., the aluminum mole fraction is greater than about 75%), indicating that the first Group III-nitride layer 152 is an AlGaN layer. In some embodiments, the aluminum mole fraction is about 1 (e.g., the aluminum mole fraction is about 100%), indicating that the first Group III-nitride layer 152 is an AlN layer. However, the first Group III-nitride layer 152 may include other Group III elements (e.g., In) without deviating from the scope of the present disclosure. The first Group III-nitride layer 152 may have a thickness $T_8$ in a range of about 5 Angstroms to about 15 Angstroms, such as about 10 Angstroms.

The multilayer structure 154 may include alternating layers of $Al_yGa_{1-y}N$ and $Al_zGa_{1-z}N$ where y and z are aluminum mole fractions of the different layers in the multilayer structure. For instance, the first layer 156 may be an $Al_yGa_{1-y}N$ layer. The second layer 158 may be an $Al_zGa_{1-z}N$ layer. The third layer 160 may be a $Al_yGa_{1-y}N$ layer similar to first layer 156 or may have a different concentration of aluminum relative to the first layer 156.

In some embodiments, the aluminum mole fraction y and the aluminum mole fraction z are different from one another so that the alternating layers in the multilayer structure 154 have different aluminum concentrations. For instance, in some embodiments, the aluminum mole fraction z is greater than the aluminum mole fraction y so that the second layer 158 has higher aluminum concentration relative to the first layer 156 and the third layer 160. In some embodiments, y is approximately equal to 1 so that the second layer 158 is an AlN layer. In some embodiments, z is approximately equal to zero (e.g., aluminum mole fraction of about 5% or less, such as 0%) such that layers the first layer 156 and the third layer 160 are GaN layers. In this way, the multilayer barrier structure 108 may have alternating layers of AlN and GaN. In some embodiments, the aluminum mole fraction z is in a range of about 0 to about 0.4 (e.g., aluminum mole fraction in a range of about 0% (e.g., 5% or less) to about 40%). In some embodiments, the aluminum mole fraction z is in a range of about 0.1 to about 0.3, such as in a range of about 0.15 to about 0.25.

A total thickness $T_9$ of the multilayer structure 154 may be greater than a thickness $T_8$ of the first Group III-nitride layer 152. For instance, the multilayer structure 154 may have a thickness $T_9$ in a range of about 70 Angstroms to about 100 Angstroms, such as about 90 Angstroms. In one example, the first layer 156 may have a thickness $T_{10}$ in a range of 20 Angstroms to 90 Angstroms. The second layer 158 may have a thickness $T_{11}$ in a range of 5 Angstroms to 90 Angstroms. The third layer 160 may have a thickness $T_{12}$ in a range of 5 Angstroms to 90 Angstroms. In some embodiments, two or more of the first layer 156, the second layer 158, and the third layer 160 have the same thickness. In some embodiments, each of the first layer 156, the second layer 158, and the third layer 160 have a different thickness.

Figure 7:
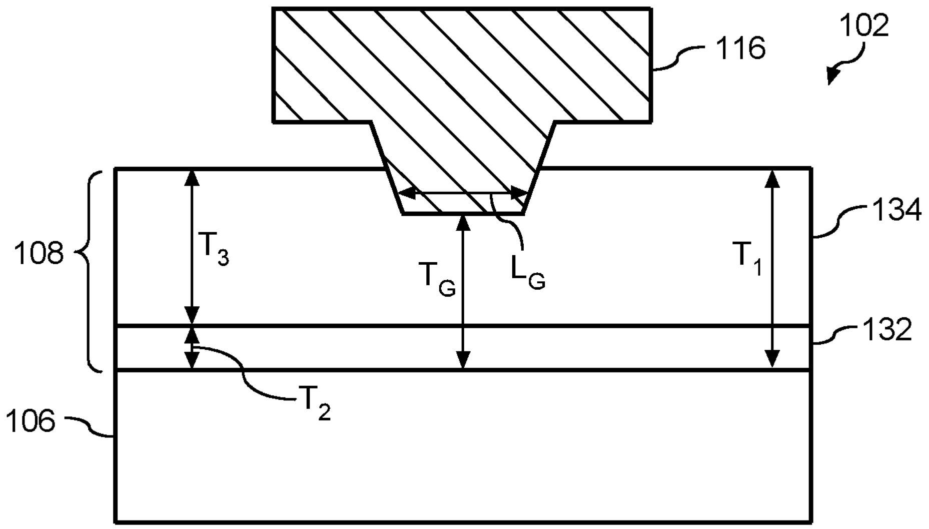
FIG. 7 depicts an example semiconductor structure for a transistor device according to example embodiments of the present disclosure.

FIG. 7 depicts an example semiconductor structure 102 according to example aspects of the present disclosure that may be used, for instance, in the HEMT device 100 of FIG. 1. FIG. 7 is intended to represent structures for identification and description and is not intended to represent the structures to physical scale. FIG. 7 depicts a semiconductor structure 102 having the configuration discussed with reference to FIG. 2. The gate contact 116, however, is recessed into the semiconductor structure 102.

As shown in FIG. 7, the gate contact 116 is recessed at least a portion of the way into the multilayer barrier structure 108. For instance, the gate contact 116 is recessed at least a portion of the way into the second Group III-nitride layer 134. The gate contact 116 may also extend or be recessed at least a portion of the way into the first Group III-nitride layer 132 without deviating from the scope of the present disclosure.

The gate contact 116 has a gate length $L_G$. The gate length $L_G$ can be the length of the lowermost portion of the gate contact 116 along the surface of the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_1$. The thickness $T_1$ may be the peak thickness of the multilayer barrier structure 108. For instance, the multilayer barrier structure 108 may have a uniform or nearly uniform thickness. In this example, the thickness $T_1$ may be the peak thickness (e.g., maximum thickness) of the multilayer barrier structure 108. The thickness $T_1$ may be in a range, for instance, of about 50 Angstroms to about 120 Angstroms. For instance, the thickness $T_1$ may be in a range of about 75 Angstroms to about 115 Angstroms. In some embodiments, the thickness $T_1$ is about 100 Angstroms. A ratio of the gate length $L_G$ of the gate contact 116 to the thickness $T_1$ of the multilayer barrier structure 108 may be in range of about 8:1 to about 16:1, such as in a range of about 9:1 to about 11:1, such as about 10:1.

The multilayer barrier structure 108 also has a thickness $T_G$ that corresponds to a distance between the gate contact 116 and the channel layer 106. The thickness $T_G$ is less than the thickness $T_1$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 8:
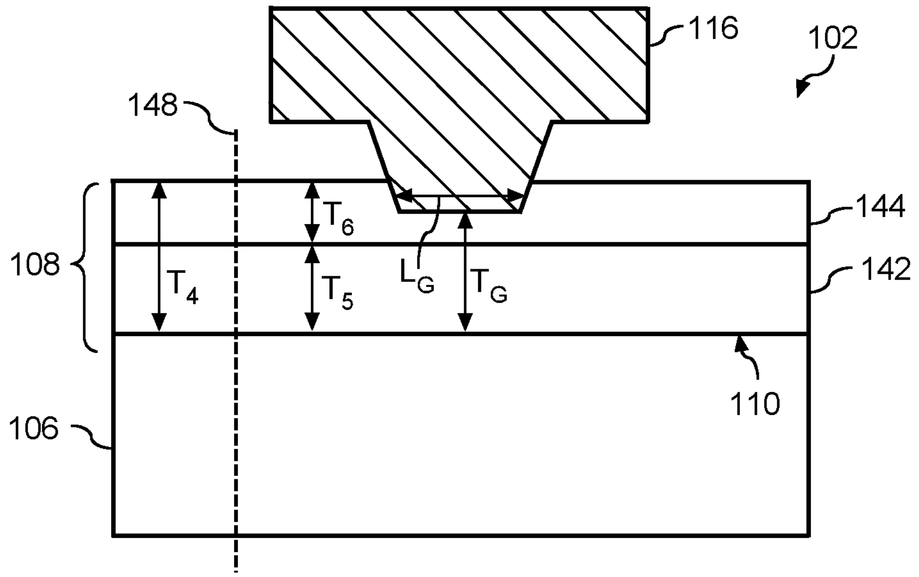
FIG. 8 depicts an example semiconductor structure for a transistor device according to example embodiments of the present disclosure.

FIG. 8 depicts an example semiconductor structure 102 according to example aspects of the present disclosure that may be used, for instance, in the HEMT device 100 of FIG. 1. FIG. 8 is intended to represent structures for identification and description and is not intended to represent the structures to physical scale. FIG. 8 depicts a semiconductor structure 102 having the configuration discussed with reference to FIG. 4. The gate contact 116, however, is recessed into the semiconductor structure 102.

As shown in FIG. 8, the gate contact 116 is recessed at least a portion of the way into the multilayer barrier structure 108. For instance, the gate contact 116 is recessed at least a portion of the way into the second Group III-nitride layer 144. The gate contact 116 may also extend or be recessed at least a portion of the way into the first Group III-nitride layer 142 without deviating from the scope of the present disclosure.

The gate contact 116 has a gate length $L_G$. The gate length $L_G$ can be the length of the lowermost portion of the gate contact 116 along the surface of the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_4$. The thickness $T_4$ may be the peak thickness of the multilayer barrier structure 108. For instance, the multilayer barrier structure 108 may have a uniform or nearly uniform thickness. In this example, the thickness $T_4$ may be the peak thickness (e.g., maximum thickness) of the multilayer barrier structure 108. The thickness $T_4$ may be in a range, for instance, of about 50 Angstroms to about 120 Angstroms. For instance, the thickness $T_4$ may be in a range of about 40 Angstroms to about 100 Angstroms. In some embodiments, the thickness $T_4$ is about 100 Angstroms. A ratio of the gate length $L_G$ of the gate contact 116 to the thickness $T_4$ of the multilayer barrier structure 108 may be in range of about 8:1 to about 16:1, such as in a range of about 9:1 to about 11:1, such as about 10:1.

The multilayer barrier structure 108 also has a thickness $T_G$ that corresponds to a distance between the gate contact 116 and the channel layer 106. The thickness $T_G$ is less than the thickness $T_4$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 9:
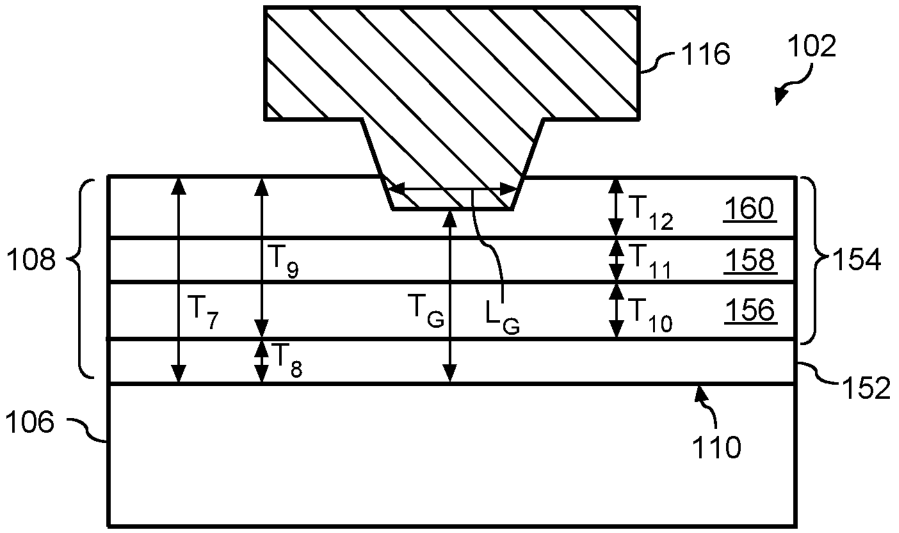
FIG. 9 depicts an example semiconductor structure for a transistor device according to example embodiments of the present disclosure.

FIG. 9 depicts an example semiconductor structure 102 according to example aspects of the present disclosure that may be used, for instance, in the HEMT device 100 of FIG. 1. FIG. 9 is intended to represent structures for identification and description and is not intended to represent the structures to physical scale. FIG. 9 depicts a semiconductor structure 102 having the configuration discussed with reference to FIG. 6. The gate contact 116, however, is recessed into the semiconductor structure 102.

As shown in FIG. 9, the gate contact 116 is recessed at least a portion of the way into the multilayer barrier structure 108. For instance, the gate contact 116 is recessed at least a portion of the way into the multilayer structure 154. The gate contact 116 may also extend or be recessed at least a portion of the way into the first Group III-nitride layer 142 without deviating from the scope of the present disclosure.

The gate contact 116 has a gate length $L_G$. The gate length $L_G$ can be the length of the lowermost portion of the gate contact 116 along the surface of the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_7$. The thickness $T_7$ may be the peak thickness of the multilayer barrier structure 108. For instance, the multilayer barrier structure 108 may have a uniform or nearly uniform thickness. In this example, the thickness $T_7$ may be the peak thickness (e.g., maximum thickness) of the multilayer barrier structure 108. The thickness $T_7$ may be in a range, for instance, of about 50 Angstroms to about 120 Angstroms. For instance, the thickness $T_7$ may be in a range of about 75 Angstroms to about 115 Angstroms. In some embodiments, the thickness $T_7$ is about 100 Angstroms. A ratio of the gate length $L_G$ of the gate contact 116 to the thickness $T_7$ of the multilayer barrier structure 108 may be in range of about 8:1 to about 16:1, such as in a range of about 9:1 to about 11:1, such as about 10:1.

The barrier structure 108 also has a thickness $T_G$ that corresponds to a distance between the gate contact 116 and the channel layer 106. The thickness $T_G$ is less than the thickness $T_7$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 10:
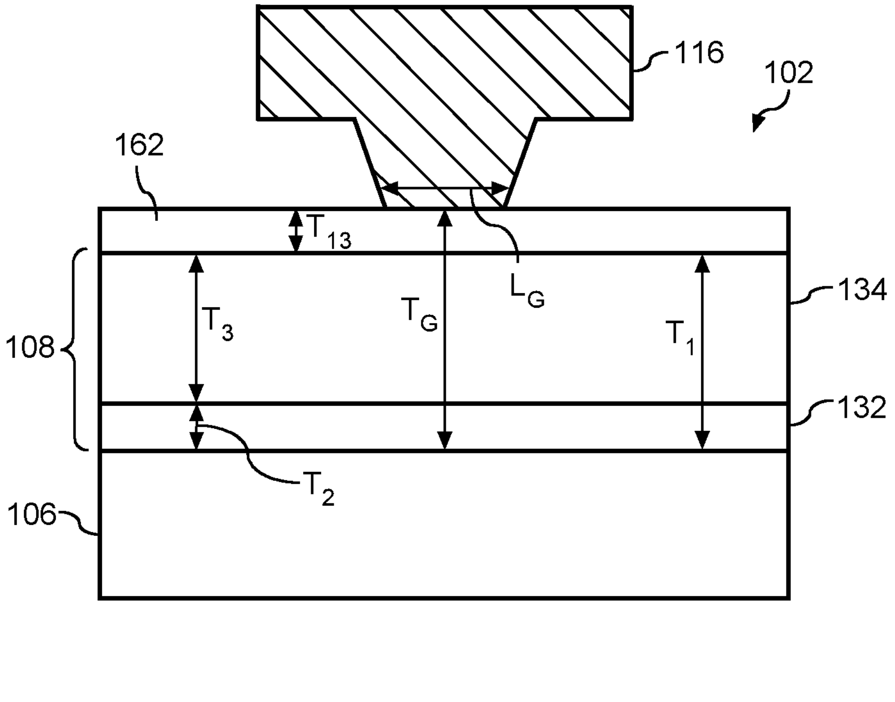
FIG. 10 depicts an example semiconductor structure for a transistor device according to example embodiments of the present disclosure.

FIG. 10 depicts an example semiconductor structure 102 according to example aspects of the present disclosure that may be used, for instance, in the HEMT device 100 of FIG. 1. FIG. 10 is intended to represent structures for identification and description and is not intended to represent the structures to physical scale. FIG. 10 depicts a semiconductor structure 102 having the configuration discussed with reference to FIG. 2. The semiconductor structure 102 of FIG. 10 additionally includes a cap layer 162 between the gate contact 116 and the barrier structure 108. The cap layer 162 may be a dielectric layer, such as SiN, $SiO_2$, MgOx, MgNx, ZnO, $SiN_x$, $SiO_x$, or $HfO_2$. In some embodiments, the cap layer 162 may be a semiconductor, such as Si, Ge, and/or a Group III-nitride. In some embodiments, the cap layer 162 may be a part of the multilayer barrier structure 108. In some embodiments, the cap layer 162 may be a Group III-nitride layer, such as a GaN layer (doped or undoped). The cap layer 162 may have a thickness $T_{13}$. The thickness $T_{13}$ may be in a range of about 20 Angstroms to about 50 Angstroms.

As shown in FIG. 10, the gate contact 116 contact is on top of the cap layer 162. The gate contact 116 has a gate length $L_G$. The gate length $L_G$ can be the length of the lowermost portion of the gate contact 116 along the surface of the cap layer 162. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_1$. The thickness $T_1$ may be the peak thickness of the multilayer barrier structure 108. For instance, the multilayer barrier structure 108 may have a uniform or nearly uniform thickness. In this example, the thickness $T_1$ may be the peak thickness (e.g., maximum thickness) of the multilayer barrier structure 108. The thickness $T_1$ may be in a range, for instance, of about 50 Angstroms to about 120 Angstroms. For instance, the thickness $T_1$ may be in a range of about 75 Angstroms to about 115 Angstroms. In some embodiments, the thickness $T_1$ is about 100 Angstroms. A ratio of the gate length $L_G$ of the gate contact 116 to the thickness $T_1$ of the multilayer barrier structure 108 may be in range of about 8:1 to about 16:1, such as in a range of about 9:1 to about 11:1, such as about 10:1.

The semiconductor structure 102 also has a thickness $T_G$ that corresponds to a distance between the gate contact 116 and the channel layer 106. The thickness $T_G$ is greater than the thickness $T_1$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 11:
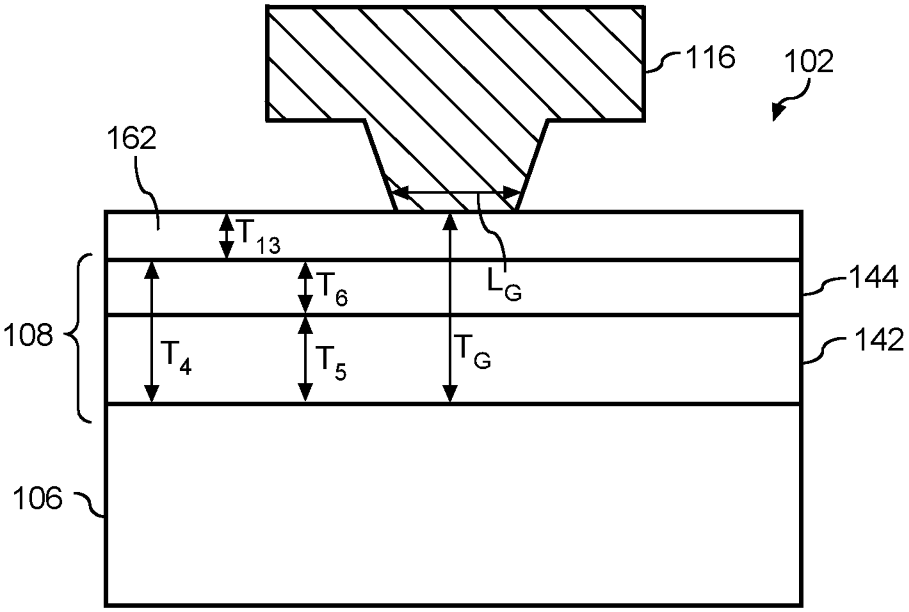
FIG. 11 depicts an example semiconductor structure for a transistor device according to example embodiments of the present disclosure.

FIG. 11 depicts an example semiconductor structure 102 according to example aspects of the present disclosure that may be used, for instance, in the HEMT device 100 of FIG. 1. FIG. 11 is intended to represent structures for identification and description and is not intended to represent the structures to physical scale. FIG. 11 depicts a semiconductor structure 102 having the configuration discussed with reference to FIG. 4. The semiconductor structure 102 of FIG. 11 additionally includes a cap layer 162 between the gate contact 116 and the barrier structure 108. The cap layer 162 may be a dielectric layer, such as SiN, $SiO_2$, MgOx, MgNx, ZnO, $SiN_X$, $SiO_x$, or $HfO_2$. In some embodiments, the cap layer 162 may be a semiconductor, such as Si, Ge, and/or a Group III-nitride. In some embodiments, the cap layer 162 may be a part of the multilayer barrier structure 108. In some embodiments, the cap layer 162 may be a Group III-nitride layer, such as a GaN layer (doped or undoped). The cap layer 162 may have a thickness $T_{13}$. The thickness $T_{13}$ may be in a range of about 20 Angstroms to about 50 Angstroms.

As shown in FIG. 11, the gate contact 116 contact is on top of the cap layer 162. The gate contact 116 has a gate length $L_G$. The gate length $L_G$ can be the length of the lowermost portion of the gate contact 116 along the surface of the cap layer 162. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_4$. The thickness $T_4$ may be the peak thickness of the multilayer barrier structure 108. For instance, the multilayer barrier structure 108 may have a uniform or nearly uniform thickness. In this example, the thickness $T_4$ may be the peak thickness (e.g., maximum thickness) of the multilayer barrier structure 108. The thickness $T_4$ may be in a range, for instance, of about 50 Angstroms to about 120 Angstroms. For instance, the thickness $T_4$ may be in a range of about 40 Angstroms to about 100 Angstroms. In some embodiments, the thickness $T_4$ is about 100 Angstroms. A ratio of the gate length $L_G$ of the gate contact 116 to the thickness $T_4$ of the multilayer barrier structure 108 may be in range of about 8:1 to about 16:1, such as in a range of about 9:1 to about 11:1, such as about 10:1.

The semiconductor structure 102 also has a thickness $T_G$ that corresponds to a distance between the gate contact 116 and the channel layer 106. The thickness $T_G$ is greater than the thickness $T_4$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 12:
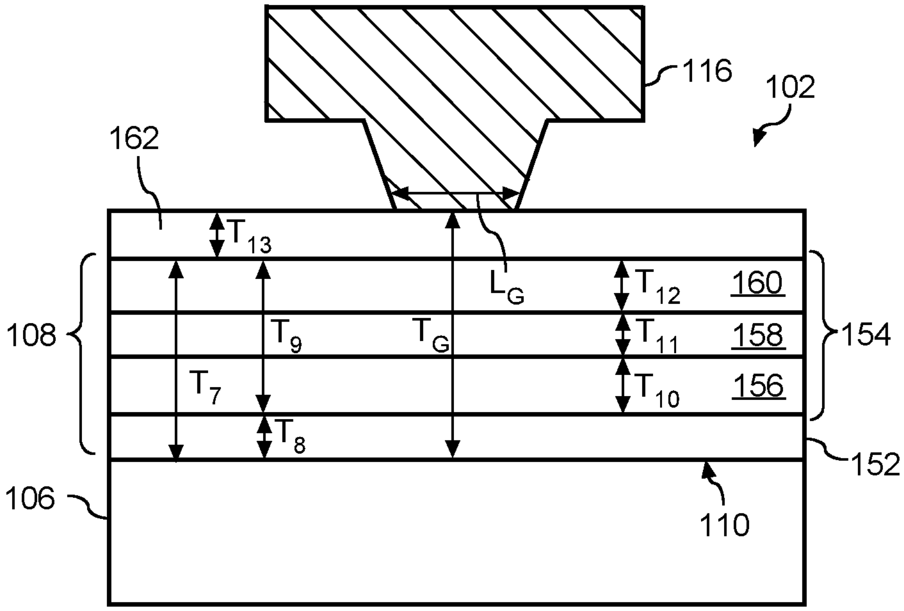
FIG. 12 depicts an example semiconductor structure for a transistor device according to example embodiments of the present disclosure.

FIG. 12 depicts an example semiconductor structure 102 according to example aspects of the present disclosure that may be used, for instance, in the HEMT device 100 of FIG. 1. FIG. 12 is intended to represent structures for identification and description and is not intended to represent the structures to physical scale. FIG. 12 depicts a semiconductor structure 102 having the configuration discussed with reference to FIG. 6. The semiconductor structure 102 of FIG. 12 additionally includes a cap layer 162 between the gate contact 116 and the barrier structure 108. The cap layer 162 may be a dielectric layer, such as SiN, $SiO_2$, MgOx, MgNx, ZnO, $SiN_X$, $SiO_x$, or $HfO_2$. In some embodiments, the cap layer 162 may be a semiconductor, such as Si, Ge, and/or a Group III-nitride. In some embodiments, the cap layer 162 may be a part of the multilayer barrier structure 108. In some embodiments, the cap layer 162 may be a Group III-nitride layer, such as a GaN layer (doped or undoped). The cap layer 162 may have a thickness $T_{13}$. The thickness $T_{13}$ may be in a range of about 20 Angstroms to about 50 Angstroms.

As shown in FIG. 12, the gate contact 116 contact is on top of the cap layer 162. The gate contact 116 has a gate length $L_G$. The gate length $L_G$ can be the length of the lowermost portion of the gate contact 116 along the surface of the cap layer 162. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm.

The multilayer barrier structure 108 may have a thickness $T_7$. The thickness $T_7$ may be the peak thickness of the multilayer barrier structure 108. For instance, the multilayer barrier structure 108 may have a uniform or nearly uniform thickness. In this example, the thickness $T_7$ may be the peak thickness (e.g., maximum thickness) of the multilayer barrier structure 108. The thickness $T_7$ may be in a range, for instance, of about 50 Angstroms to about 120 Angstroms. For instance, the thickness $T_7$ may be in a range of about 75 Angstroms to about 115 Angstroms. In some embodiments, the thickness $T_7$ is about 100 Angstroms. A ratio of the gate length $L_G$ of the gate contact 116 to the thickness $T_7$ of the multilayer barrier structure 108 may be in range of about 8:1 to about 16:1, such as in a range of about 9:1 to about 11:1, such as about 10:1.

The semiconductor structure 102 also has a thickness $T_G$ that corresponds to a distance between the gate contact 116 and the channel layer 106. The thickness $T_G$ is greater than the thickness $T_7$. In some embodiments, the thickness $T_G$ may be configured such that a ratio of the gate length $L_G$ of the gate contact 116 to the thickness $T_G$ is in range of about 8:1 to about 16:1, such as in a range of about 9:1 to about 11:1, such as about 10:1.

Figure 13:
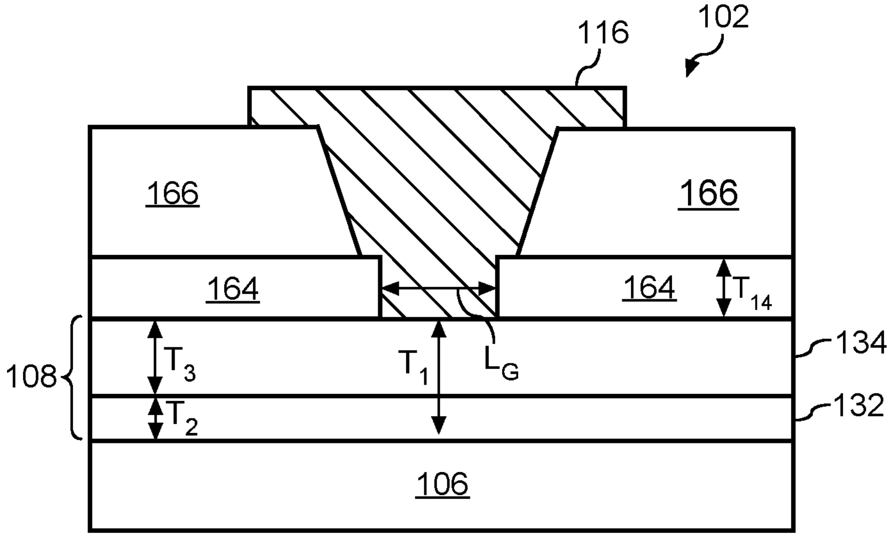
FIG. 13 depicts an example semiconductor structure for a transistor device according to example embodiments of the present disclosure.

FIG. 13 depicts an example semiconductor structure 102 according to example aspects of the present disclosure that may be used, for instance, in an HEMT device 100. FIG. 13 is intended to represent structures for identification and description and is not intended to represent the structures to physical scale. FIG. 13 depicts a semiconductor structure 102 having the configuration discussed with reference to FIG. 2. The HEMT device of FIG. 13 additionally includes a protective layer 164 and/or an insulating layer 166.

The protective layer 164 may be a dielectric layer, such as SiN, $SiO_2$, MgOx, MgNx, ZnO, $SiN_X$, $SiO_x$, and/or other suitable protective material. Other materials may also be utilized for the protective layer 164. For example, the protective layer 164 may also include magnesium oxide, scandium oxide, aluminum oxide and/or aluminum oxynitride. Furthermore, the protective layer 164 may be a single layer or may include multiple layers of uniform and/or non-uniform composition. The protective layer 164 may have a thickness $T_{14}$ of about 30 nm, however, other thicknesses may also be utilized. For example, the protective layer 164 may have a thickness in a range from about 10 nm to about 500 nm. The protective layer 164 may have an opening for formation and/or accommodating of the gate contact 116.

The insulating layer 166 may be a dielectric layer. Different dielectric materials may be used such as a SiN, $SiO_2$, Si, Ge, MgOx, MgNx, ZnO, SiNx, $SiO_x$, alloys or layer sequences thereof, or epitaxial materials. The insulating layer 166 may or may not be present in the HEMT device of FIG. 13.

The gate contact 116 extends through the protective layer 164 to contact the multilayer barrier structure 108. The gate contact 116 may also extend directly on opposing sidewalls of the opening in the protective layer 164, such that a gap may not be present between the gate contact 116 and the protective layer 164. In addition, the opening in the protective layer 164 and the insulating layer 166 may be self-aligned. A width of the opening in the insulating layer 166 may be self-aligned and symmetric around a width of the opening of the protective layer 164. The gate contact 116 has a gate length $L_G$ along the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm. In addition, the angle of the sidewalls of the protective layer 166 may be in a range of about 45 degrees to about 90 degrees.

The multilayer barrier structure 108 may have a thickness $T_1$. The thickness $T_1$ may be the peak thickness of the multilayer barrier structure 108. For instance, the multilayer barrier structure 108 may have a uniform or nearly uniform thickness. In this example, the thickness $T_1$ may be the peak thickness (e.g., maximum thickness) of the multilayer barrier structure 108. The thickness $T_1$ may be in a range, for instance, of about 50 Angstroms to about 120 Angstroms. For instance, the thickness $T_1$ may be in a range of about 75 Angstroms to about 115 Angstroms. In some embodiments, the thickness $T_1$ is about 100 Angstroms. A ratio of the gate length $L_G$ of the gate contact 116 to the thickness $T_1$ of the multilayer barrier structure 108 may be in range of about 8:1 to about 16:1, such as in a range of about 9:1 to about 11:1, such as about 10:1.

Figure 14:
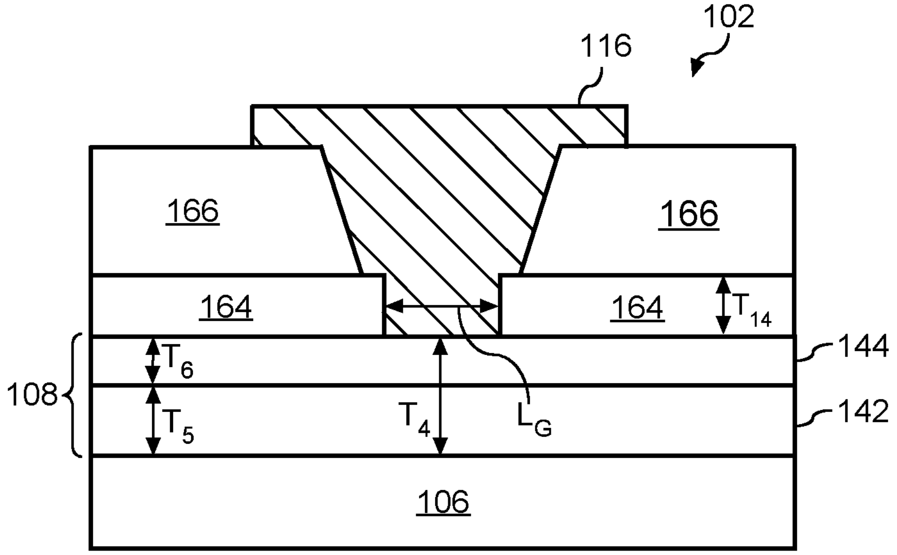
FIG. 14 depicts an example semiconductor structure for a transistor device according to example embodiments of the present disclosure.

FIG. 14 depicts an example semiconductor structure 102 according to example aspects of the present disclosure that may be used, for instance, in an HEMT device 100. FIG. 14 is intended to represent structures for identification and description and is not intended to represent the structures to physical scale. FIG. 14 depicts a semiconductor structure 102 having the configuration discussed with reference to FIG. 4. The HEMT device of FIG. 14 additionally includes a protective layer 164 and/or an insulating layer 166.

The protective layer 164 may be a dielectric layer, such as SiN, $SiO_2$, MgOx, MgNx, ZnO, $SiN_X$, $SiO_x$, and/or other suitable protective material. Other materials may also be utilized for the protective layer 164. For example, the protective layer 164 may also include magnesium oxide, scandium oxide, aluminum oxide and/or aluminum oxynitride. Furthermore, the protective layer 164 may be a single layer or may include multiple layers of uniform and/or non-uniform composition. The protective layer 164 may have a thickness $T_{14}$ of about 30 nm, however, other thicknesses may also be utilized. For example, the protective layer 164 may have a thickness in a range from about 10 nm to about 500 nm. The protective layer 164 may have an opening for formation and/or accommodating of the gate contact 116.

The insulating layer 166 may be a dielectric layer. Different dielectric materials may be used such as a SiN, $SiO_2$, Si, Ge, MgOx, MgNx, ZnO, SiNx, $SiO_x$, alloys or layer sequences thereof, or epitaxial materials. The insulating layer 166 may or may not be present in the HEMT device of FIG. 14.

The gate contact 116 extends through the protective layer 164 to contact the multilayer barrier structure 108. The gate contact 116 may also extend directly on opposing sidewalls of the opening in the protective layer 164, such that a gap may not be present between the gate contact 116 and the protective layer 164. In addition, the opening in the protective layer 164 and the insulating layer 166 may be self-aligned. A width of the opening in the insulating layer 166 may be self-aligned and symmetric around a width of the opening of the protective layer 164. The gate contact 116 has a gate length $L_G$ along the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm. In addition, the angle of the sidewalls of the protective layer 166 may be in a range of about 45 degrees to about 90 degrees.

The multilayer barrier structure 108 may have a thickness $T_4$. The thickness $T_4$ may be the peak thickness of the multilayer barrier structure 108. For instance, the multilayer barrier structure 108 may have a uniform or nearly uniform thickness. In this example, the thickness $T_4$ may be the peak thickness (e.g., maximum thickness) of the multilayer barrier structure 108. The thickness $T_4$ may be in a range, for instance, of about 50 Angstroms to about 120 Angstroms. For instance, the thickness $T_4$ may be in a range of about 40 Angstroms to about 100 Angstroms. In some embodiments, the thickness $T_4$ is about 100 Angstroms. A ratio of the gate length $L_G$ of the gate contact 116 to the thickness $T_4$ of the multilayer barrier structure 108 may be in range of about 8:1 to about 16:1, such as in a range of about 9:1 to about 11:1, such as about 10:1.

Figure 15:
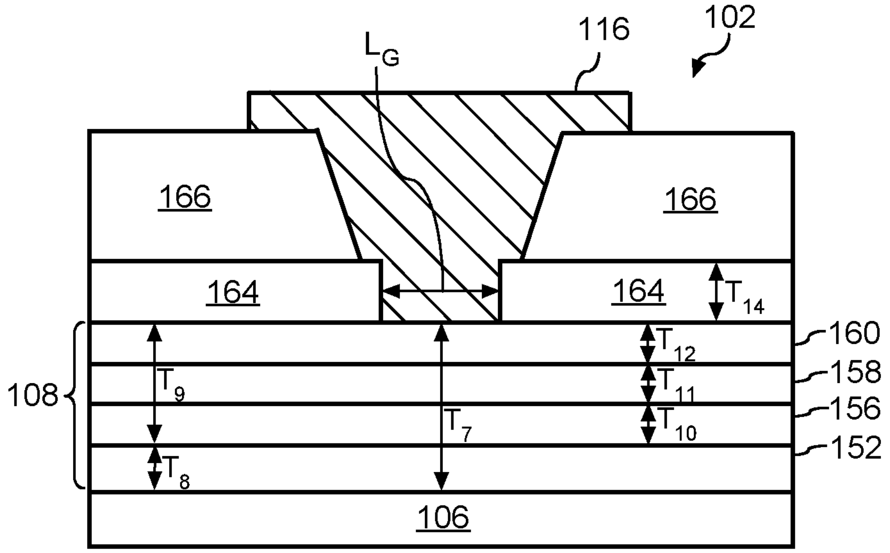
FIG. 15 depicts an example semiconductor structure for a transistor device according to example embodiments of the present disclosure.

FIG. 15 depicts an example semiconductor structure 102 according to example aspects of the present disclosure that may be used, for instance, in an HEMT device 100. FIG. 15 is intended to represent structures for identification and description and is not intended to represent the structures to physical scale. FIG. 15 depicts a semiconductor structure 102 having the configuration discussed with reference to FIG. 6. The HEMT device of FIG. 15 additionally includes a protective layer 164 and/or an insulating layer 166.

The protective layer 164 may be a dielectric layer, such as SiN, $SiO_2$, MgOx, MgNx, ZnO, $SiN_X$, $SiO_x$, and/or other suitable protective material. Other materials may also be utilized for the protective layer 164. For example, the protective layer 164 may also include magnesium oxide, scandium oxide, aluminum oxide and/or aluminum oxynitride. Furthermore, the protective layer 164 may be a single layer or may include multiple layers of uniform and/or non-uniform composition. The protective layer 164 may have a thickness $T_{14}$ of about 30 nm, however, other thicknesses may also be utilized. For example, the protective layer 164 may have a thickness in a range from about 10 nm to about 500 nm. The protective layer 164 may have an opening for formation and/or accommodating of the gate contact 116.

The insulating layer 166 may be a dielectric layer. Different dielectric materials may be used such as a SiN, $SiO_2$, Si, Ge, MgOx, MgNx, ZnO, SiNx, $SiO_x$, alloys or layer sequences thereof, or epitaxial materials. The insulating layer 166 may or may not be present in the HEMT device of FIG. 15.

The gate contact 116 extends through the protective layer 164 to contact the multilayer barrier structure 108. The gate contact 116 may also extend directly on opposing sidewalls of the opening in the protective layer 164, such that a gap may not be present between the gate contact 116 and the protective layer 164. In addition, the opening in the protective layer 164 and the insulating layer 166 may be self-aligned. A width of the opening in the insulating layer 166 may be self-aligned and symmetric around a width of the opening of the protective layer 164. The gate contact 116 has a gate length $L_G$ along the multilayer barrier structure 108. In some embodiments, the gate length $L_G$ may be about 100 nm or less, such as about 90 nm or less, such as about 60 nm or less. In some embodiments, the gate length $L_G$ may be in a range of about 40 nm to about 90 nm, such as about 60 nm to about 90 nm. In some embodiments, the gate length $L_G$ is about 90 nm. In addition, the angle of the sidewalls of the protective layer 166 may be in a range of about 45 degrees to about 90 degrees.

The multilayer barrier structure 108 may have a thickness $T_7$. The thickness $T_7$ may be the peak thickness of the multilayer barrier structure 108. For instance, the multilayer barrier structure 108 may have a uniform or nearly uniform thickness. In this example, the thickness $T_7$ may be the peak thickness (e.g., maximum thickness) of the multilayer barrier structure 108. The thickness $T_7$ may be in a range, for instance, of about 50 Angstroms to about 120 Angstroms. For instance, the thickness $T_7$ may be in a range of about 75 Angstroms to about 115 Angstroms. In some embodiments, the thickness $T_7$ is about 100 Angstroms. A ratio of the gate length $L_G$ of the gate contact 116 to the thickness $T_7$ of the multilayer barrier structure 108 may be in range of about 8:1 to about 16:1, such as in a range of about 9:1 to about 11:1, such as about 10:1.

Examples embodiments of the present disclosure are described in the following paragraphs.

One example embodiment of the present disclosure is directed to a transistor device. The transistor device includes a channel layer. The transistor device includes a multilayer barrier structure on the channel layer. The transistor device includes a gate contact having a gate length of about 100 nm or less. A ratio of the gate length to a thickness of the multilayer barrier structure is in a range of about 8:1 to about 16:1.

In some examples, the ratio of the gate length to the thickness of the multilayer barrier structure is in a range of about 8:1 to 12:1.

In some examples, the ratio of the gate length to the thickness of the multilayer barrier structure is about 10:1.

In some examples, a two-dimensional electron gas (2 DEG) at an interface between the channel layer and the multilayer barrier structure has an electron mobility in a range of about 800 cm2/Vs to about 2500 cm2/Vs.

In some examples, a two-dimensional electron gas (2 DEG) at an interface between the channel layer and the multilayer barrier structure has an electron mobility in a range of about 1600 cm2/Vs to about 2200 cm2/Vs.

In some examples, a two-dimensional electron gas (2 DEG) at an interface between the channel layer and the multilayer barrier structure has a carrier concentration in a range of about $1.2\times10^{13}$ $cm^{-2}$ to about $2.0\times10^{13}$ $cm^{-2}$.

In some examples, a two-dimensional electron gas (2 DEG) at an interface between the channel layer and the multilayer barrier structure has a transconductance in a range of about 500 mS/mm to about 800 mS/mm.

In some examples, the multilayer barrier structure has a peak thickness in a range of about 50 Angstroms to about 120 Angstroms.

In some examples, the multilayer barrier structure comprises a Group III-nitride based barrier structure.

In some examples, the multilayer barrier structure comprises a first Group III-nitride layer and a second Group III-nitride layer on the first Group III-nitride layer.

In some examples, the first Group III-nitride layer is an $Al_xGa_{1-x}N$ layer, where x≥0.75, wherein the second Group III-nitride layer is an $Al_yGa_{1-y}N$ layer, where y≥0.3, such as 0.3≤y≤0.4.

In some examples, the first Group III-nitride layer has a thickness in a range of about in a range of about 5 Angstroms to about 15 Angstroms and the second Group III-nitride layer has a thickness in a range of about 70 Angstroms to about 100 Angstroms.

In some examples, the first Group III-nitride layer is an $Al_xGa_{1-x}N$ layer, where x≥0.75, wherein the second Group III-nitride layer is a GaN layer.

In some examples, the first Group III-nitride layer has a thickness in a range of about 30 Angstroms to about 60 Angstroms and the second Group III-nitride layer has a thickness in a range of about 10 Angstroms to about 70 Angstroms.

In some examples, the multilayer barrier structure comprises a plurality Group III-nitride layers arranged in an alternating manner.

In some examples, the multilayer barrier structure comprises a plurality of AlN layers and a plurality of GaN layers arranged in an alternating manner.

In some examples, the gate length of the gate contact is in a range of about 40 nm to about 90 nm. In some examples, the gate length of the gate contact is in a range of about 60 nm to about 90 nm. In some examples, the gate length of the gate contact is about 90 nm.

In some examples, the gate contact is recessed into the multilayer barrier structure, wherein a ratio of the gate length to a distance between the gate contact and the channel layer is in a range of about 8:1 to about 16:1.

In some examples, the transistor device further comprises a cap layer adjacent the gate contact, wherein a ratio of the gate length to a distance between the gate contact and the channel layer is in a range of about 8:1 to about 16:1.

In some examples, the transistor device is a high electron mobility transistor device. In some examples, the channel layer is on a silicon carbide substrate.

Another example embodiment of the present disclosure is directed to a transistor device. The transistor device includes a channel layer. The transistor device includes a Group III-nitride based barrier structure on the channel layer. The transistor device includes a gate contact. The Group III-nitride based barrier structure has a peak thickness of less than about 120 Angstroms.

In some examples, a gate length of the gate contact is about 100 nm or less. In some examples, a gate length of the gate contact is in a range of about 40 nm to about 90 nm. In some examples, a gate length of the gate contact is in a range of about 60 nm to about 90 nm. In some examples, a gate length of the gate contact is about 90 nm.

In some examples, the peak thickness of the Group III-nitride based barrier structure is in a range of about 50 Angstroms to about 120 Angstroms.

In some examples, the peak thickness of the Group III-nitride based barrier structure is in a range of about 70 Angstroms to 100 Angstroms.

In some examples, a two-dimensional electron gas (2 DEG) at an interface between the channel layer and the Group III-nitride based barrier structure has an electron mobility in a range of about 800 cm2/Vs to about 2500 cm2/Vs.

In some examples, a two-dimensional electron gas (2 DEG) at an interface between the channel layer and the Group III-nitride based barrier structure has a transconductance in a range of about 500 mS/mm to about 800 mS/mm.

In some examples, a two-dimensional electron gas (2 DEG) at an interface between the channel layer and the Group III-nitride based barrier structure has a carrier concentration in a range of about $1.2\times10^{13}$ $cm^{-2}$ to about $2.0\times10^{13}$ $cm^{-2}$.

In some examples, the Group III-nitride based barrier structure comprises a first Group III-nitride layer and a second Group III-nitride layer on the first Group III-nitride layer In some examples, the first Group III-nitride layer is an $Al_xGa_{1-x}N$ layer, where x≥0.75, wherein the second Group III-nitride layer is an $Al_yGa_{1-y}N$ layer, where y≥0.3, such as 0.3≤y≤0.4.

In some examples, the first Group III-nitride layer has a thickness in a range of about in a range of about 5 Angstroms to about 15 Angstroms and the second Group III-nitride layer has a thickness in a range of about 70 Angstroms to about 100 Angstroms.

In some examples, the first Group III-nitride layer is an $Al_xGa_{1-x}N$ layer, where x≥0.75, wherein the second Group III-nitride layer is an $Al_yGa_{1-y}N$ layer, where y is approximately 0.

In some examples, the first Group III-nitride layer has a thickness in a range of about 30 Angstroms to about 60 Angstroms and the second Group III-nitride layer has a thickness in a range of about 10 Angstroms to about 70 Angstroms.

In some examples, Group III-nitride based barrier structure comprises a plurality Group III-nitride layers arranged in an alternating manner.

In some examples, the Group III-nitride based barrier structure comprises a plurality of AlN layers and a plurality of GaN layers arranged in an alternating manner.

In some examples, the transistor device is a high electron mobility transistor device. In some examples, the channel layer is on a silicon carbide substrate.

Another example embodiment of the present disclosure is directed to a transistor device. The transistor device includes a channel layer. The transistor device includes a barrier structure on the channel layer. The transistor device includes a gate contact having a gate length in a range of about 60 nm to about 100 nm. The transistor device includes a two-dimensional electron gas (2 DEG) at an interface between the channel layer and the barrier structure, the 2 DEG having an electron mobility in a range of about 800 cm2/Vs to about 2500 cm2/Vs.

In some examples, the 2 DEG at the interface between the channel layer and the barrier structure has a transconductance about 500 mS/mm to about 800 mS/mm. In some examples, the 2 DEG has a carrier concentration in a range of about $1.2\times10^{13}$ $cm^{-2}$ to about $2.0\times10^{13}$ $cm^{-2}$.

In some examples, a peak thickness of the barrier structure is in a range of about 50 Angstroms to 120 Angstroms.

In some examples, the barrier structure comprises an AlN layer and an AlGaN layer on the AlN layer, the AlGaN layer having an aluminum mole fraction of about 30% or greater.

In some examples, the AlN layer has a thickness in a range of 5 Angstroms to 15 Angstroms and the AlGaN layer has a thickness in a range of about 70 Angstroms to about 100 Angstroms.

In some examples, the barrier structure comprises a plurality of Group III-nitride layers arranged in an alternating manner.

In some examples, the barrier structure comprises an AlN layer and a GaN layer on the AlN layer.

In some examples, the AlN layer has a thickness in a range of about 30 Angstroms to about 60 Angstroms and the GaN layer has a thickness in a range of about 10 Angstroms to about 70 Angstroms.

Another example embodiment of the present disclosure is directed to a transistor device. The transistor device includes a channel layer. The transistor device includes a barrier structure on the channel layer. The transistor device includes a two-dimensional electron gas (2 DEG) at an interface between the channel layer and the barrier structure, the 2 DEG having a transconductance in a range of about 500 mS/mm to about 800 mS/mm. A peak thickness of the barrier structure is in a range of about 50 Angstroms to about 120 Angstroms.

In some examples, the 2 DEG at the interface between the channel layer and the barrier structure has an electron mobility in a range of about 1600 cm2/Vs to about 2200 cm2/Vs.

In some examples, the 2 DEG has a carrier concentration in a range of about $1.2\times10^{13}$ $cm^{-2}$ to about $2.0\times10^{13}$ $cm^{-2}$.

In some examples, the transistor device further comprises a gate length in a range of about 60 nm to about 90 nm;

In some examples, the barrier structure comprises an AlN layer and an AlGaN layer on the AlN layer, the AlGaN layer having an aluminum mole fraction of about 30% or greater.

In some examples, the AlN layer has a thickness in a range of 5 Angstroms to 15 Angstroms and the AlGaN layer has a thickness in a range of about 70 Angstroms to about 100 Angstroms.

In some examples, the barrier structure comprises a plurality of Group III-nitride layers arranged in an alternating manner.

In some examples, the barrier structure comprises an AlN layer and an GaN layer on the AlN layer.

In some examples, the AlN layer has a thickness in a range of about 30 Angstroms to about 60 Angstroms and the GaN layer has a thickness in a range of about 10 Angstroms to about 70 Angstroms.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A transistor device comprising:

a channel layer;

a multilayer barrier structure on the channel layer, the multilayer barrier structure comprising a first Group III-nitride layer having a thickness in a range of about 5 Angstroms to about 15 Angstroms and a second Group III-nitride layer, different than the first Group III-nitride layer, having a thickness in a range of about 70 Angstroms to about 100 Angstroms; and a gate contact having a gate length of about 100 nm or less, wherein;

a ratio of the gate length to a thickness of the multilayer barrier structure is in a range of about 8:1 to about 16:1; and the first Group III-nitride layer is an $Al_xGa_{1-x}N$ layer, where x≥0.75, and the second Group III-nitride layer is an $Al_yGa_{1-y}N$ layer, where y≥0.3.

2. The transistor device of claim 1, wherein the ratio of the gate length to the thickness of the multilayer barrier structure is in a range of about 8:1 to 12:1.

3. The transistor device of claim 1, wherein a two-dimensional electron gas (2 DEG) at an interface between the channel layer and the multilayer barrier structure has an electron mobility in a range of about 800 $cm^2/Vs$ to about 2500 $cm^2/Vs$.

4. The transistor device of claim 1, wherein a two-dimensional electron gas (2 DEG) at an interface between the channel layer and the multilayer barrier structure has a carrier concentration in a range of about $1.2\times10^{13}$ $cm^{-2}$ to about $2.0\times10^{13}$ $cm^{-2}$.

5. The transistor device of claim 1, wherein a two-dimensional electron gas (2 DEG) at an interface between the channel layer and the multilayer barrier structure has a transconductance in a range of about 500 mS/mm to about 800 mS/mm.

6. The transistor device of claim 1, wherein the multilayer barrier structure has a peak thickness in a range of about 50 Angstroms to about 120 Angstroms.

7. The transistor device of claim 1, wherein the second Group III-nitride layer is over the first Group III-nitride layer.

8. The transistor device of claim 1, wherein the multilayer barrier structure comprises a plurality of Group III-nitride layers arranged in an alternating manner.

9. The transistor device of claim 1, wherein the gate length of the gate contact is in a range of about 40 nm to about 90 nm.

10. The transistor device of claim 1, wherein the gate length of the gate contact is in a range of about 60 nm to about 90 nm.

11. The transistor device of claim 1, wherein the gate contact is recessed into the multilayer barrier structure, wherein a ratio of the gate length to a distance between the gate contact and the channel layer is in a range of about 8:1 to about 16:1.

12. The transistor device of claim 1, wherein the transistor device further comprises a cap layer adjacent the gate contact, wherein a ratio of the gate length to a distance between the gate contact and the channel layer is in a range of about 8:1 to about 16:1.

13. The transistor device of claim 1, wherein the transistor device is a high electron mobility transistor device.

14. The transistor device of claim 1, wherein the channel layer is on a silicon carbide substrate.

15. A transistor device comprising:

a channel layer;

a multilayer barrier structure on the channel layer, the multilayer barrier structure comprising a first Group III-nitride layer having a thickness in a range of about 5 Angstroms to about 15 Angstroms and a second Group III-nitride layer, different than the first Group III-nitride layer, having a thickness in a range of about 70 Angstroms to about 100 Angstroms; and a gate contact having a gate length of about 100 nm or less, wherein:

a ratio of the gate length to a thickness of the multilayer barrier structure is in a range of about 8:1 to about 16:1; and the first Group III-nitride layer is an $Al_xGa_{1-x}N$ layer, where x≥0.75, and the second Group III-nitride layer is a GaN layer.

16. The transistor device of claim 15, wherein the first Group III-nitride layer has a thickness of about 10 Angstroms and the second Group III-nitride layer has a thickness of about 90 Angstroms.

17. A transistor device comprising:

a channel layer;

a Group III-nitride based barrier structure on the channel layer, the Group III-nitride based barrier structure comprising a first Group III-nitride layer having a thickness in a range of about 5 Angstroms to about 15 Angstroms and a second Group III-nitride layer, different than the first Group III-nitride layer, having a thickness in a range of about 70 Angstroms to about 100 Angstroms; and a gate contact, wherein:

the Group III-nitride based barrier structure has a peak thickness of less than about 120 Angstroms; and the first Group III-nitride layer is an $Al_xGa_{1-x}N$ layer, where x≥0.75, and the second Group III-nitride layer is an $Al_yGa_{1-y}N$ layer, where y≥0.3.

18. The transistor device of claim 17, wherein a gate length of the gate contact is about 100 nm or less.

19. The transistor device of claim 17, wherein a gate length of the gate contact is in a range of about 60 nm to about 90 nm.

20. The transistor device of claim 17, wherein the peak thickness of the Group III-nitride based barrier structure is in a range of about 50 Angstroms to about 120 Angstroms.

21. The transistor device of claim 17, wherein the second Group III-nitride layer is over the first Group III-nitride layer.

22. A transistor device comprising:

a channel layer;

a barrier structure on the channel layer, the barrier structure comprising an AlN layer having a thickness in a range of 5 Angstroms to 15 Angstroms and an AlGaN layer having a thickness in a range of greater than 70 Angstroms to less than 100 Angstroms;

a gate contact having a gate length in a range of about 60 nm to about 100 nm; and a two-dimensional electron gas (2 DEG) at an interface between the channel layer and the barrier structure, the 2 DEG having an electron mobility in a range of about 800 $cm^2/Vs$ to about 2500 $cm^2/Vs$.

23. The transistor device of claim 22, wherein the 2 DEG at the interface between the channel layer and the barrier structure has a transconductance in a range of about 500 mS/mm to about 800 mS/mm.

24. The transistor device of claim 22, wherein a peak thickness of the barrier structure is in a range of about 50 Angstroms to 120 Angstroms.

25. The transistor device of claim 22, wherein the AlGaN layer is over the AlN layer, the AlGaN layer having an aluminum mole fraction of about 30% or greater.

26. A transistor device, comprising:

a channel layer;

a barrier structure on the channel layer, the barrier structure comprising an AlN layer having a thickness in a range of 5 Angstroms to 15 Angstroms and an AlGaN layer having a thickness in a range of greater than 70 Angstroms to less than 100 Angstroms; and a two-dimensional electron gas (2 DEG) at an interface between the channel layer and the barrier structure, the 2 DEG having a transconductance in a range of about 500 mS/mm to about 800 mS/mm, wherein a peak thickness of the barrier structure is in a range of about 50 Angstroms to about 120 Angstroms.

27. The transistor device of claim 26, further comprising a gate contact having a gate length in a range of about 60 nm to about 90 nm.

28. The transistor device of claim 26, wherein the AlGaN layer is over the AlN layer, the AlGaN layer having an aluminum mole fraction of about 30% or greater.

* * * * *